US010817152B2

(12) United States Patent
Hournbuckle, Jr. et al.

(10) Patent No.: US 10,817,152 B2
(45) Date of Patent: Oct. 27, 2020

(54) INDUSTRIAL ASSET INTELLIGENCE

(71) Applicant: GE Inspection Technologies, LP, Lewistown, PA (US)

(72) Inventors: Bobby Dale Hournbuckle, Jr., Skaneateles, NY (US); Matthew Harvey Krohn, Lewistown, PA (US); Mark Rosenberg, San Ramon, CA (US); Tara Merry, Lewistown, PA (US); Naren Pradyumna Dasu, San Ramon, CA (US); Mary Campos, San Ramon, CA (US); Williams Garcia, San Ramon, CA (US); Grigory Nudelman, San Ramon, CA (US)

(73) Assignee: GE Inspection Technologies, LP, Lewistowm, PA (US)

( * ) Notice: Subject to any disclaimer, the term of this patent is extended or adjusted under 35 U.S.C. 154(b) by 0 days.

(21) Appl. No.: 16/128,328

(22) Filed: Sep. 11, 2018

(65) Prior Publication Data
US 2019/0087990 A1  Mar. 21, 2019

Related U.S. Application Data

(60) Provisional application No. 62/716,064, filed on Aug. 8, 2018, provisional application No. 62/559,625, filed on Sep. 17, 2017.

(51) Int. Cl.
*G06F 3/0484*  (2013.01)
*G06F 3/0481*  (2013.01)
(Continued)

(52) U.S. Cl.
CPC ...... *G06F 3/04842* (2013.01); *G06F 3/04817* (2013.01); *G06F 30/20* (2020.01);
(Continued)

(58) Field of Classification Search
CPC ... G06T 11/206; G06T 2200/24; G06T 11/20; G05B 15/02; G05B 19/0428;
(Continued)

(56) References Cited

U.S. PATENT DOCUMENTS

2014/0365271 A1* 12/2014 Smiley ............... G06Q 10/0635
705/7.28
2015/0169190 A1* 6/2015 Girardeau ........... G06F 3/04842
715/771
2016/0321330 A1* 11/2016 Ziegler ............... G06F 3/04842

* cited by examiner

*Primary Examiner* — Xilin Guo
(74) *Attorney, Agent, or Firm* — Mintz Levin Cohn Ferris Glovsky and Popeo, P.C.

(57) ABSTRACT

A method can include receiving data identifying an industrial asset. The method can also include receiving data characterizing one or more sensors configured to detect a first property of the asset. The method can further include determining a first graphical representation of the asset based on the received data identifying the industrial asset, and a second graphical representation of a first sensor of the one or more sensors based on the received data characterizing one or more properties of one or more sensors. The method can further include rendering, in a graphical display space, the first graphical representation and the second graphical representation. One or more visual properties of the second graphical representation can be indicative of one or more properties of the first sensor and/or the detected first property of the asset. A position of the second graphical representation in the graphical display space relative to the first graphical representation can be indicative of a first location of the first sensor on the asset.

16 Claims, 35 Drawing Sheets

(51) Int. Cl.
    *G06T 11/20* (2006.01)
    *G06F 30/20* (2020.01)
    *G05B 15/02* (2006.01)
(52) U.S. Cl.
    CPC ............ *G06T 11/206* (2013.01); *G05B 15/02* (2013.01); *G06T 2200/24* (2013.01)
(58) Field of Classification Search
    CPC ................ G05B 19/058; G05B 19/418; G05B 2219/14006; G05B 2219/23258; G05B 2219/23386; G05B 2219/24033; G05B 2219/25014; G05B 2219/25062; G05B 2219/31457; G06F 3/04842; G06F 17/5009; G06F 3/04817; G06K 9/6267
    See application file for complete search history.

| Predictive corrosion monitoring inspection report | | | | | | | | |
|---|---|---|---|---|---|---|---|---|
| Report Details | | | | | | | | |
| Report no | Date of report | | Begin date | | End date | | | |
| | 1/1/17 | | 1/1/17 | | 1/1/17 | | | |
| Customer | | | Plant | | | | | |
| Refinery revolutions | | | Sterling | | | | | |
| Component | | | Section | | | | | |
| Coke drums | | | Section 1 | | | | | |
| Measurement position | | | Distance :0.0mm | | Caution threshold :9130000.0mm | | | |
| 4 | | | Angle :0.0° | | Minimal threshold :3000000.0mm | | | |
| Ultrasonic inspection results | | | | | | | | |
| Sensor position name | Date | Time | Temp°C | Result in mm | Result in inch | Post process | Status |
| 4 | 05/25/2017 | 06:00:40 | 1.89308189749E7 | 123.6 | 5.044897959 | Correlation | Status |
| 4 | 05/25/2017 | 09:00:45 | 1.89183348956E7 | 129.9 | 5.302040816 | Correlation | Status |
| 4 | 05/25/2017 | 12:00:52 | 1.89026609973E7 | 138.45 | 5.651020408 | Correlation | Status |
| 4 | 05/25/2017 | 15:00:54 | 1.88921368824E7 | 145.5 | 5.93877551 | Correlation | Status |
| 4 | 05/25/2017 | 18:00:58 | 1.89172927297E7 | 131.25 | 5.357142857 | Correlation | Status |
| 4 | 05/25/2017 | 21:00:30 | 1.89163492517E7 | 132.15 | 5.39387755 | Correlation | Status |
| 4 | 05/26/2017 | 00:00:34 | 1.89323792027E7 | 125.25 | 5.112244898 | Correlation | Status |
| 4 | 05/26/2017 | 03:00:38 | 1.88985487837E7 | 137.1 | 5.595918367 | Correlation | Status |
| 4 | 05/26/2017 | 06:00:45 | 1.89429962197E7 | 118.9 | 4.853061224 | Correlation | Status |
| 4 | 05/26/2017 | 09:00:52 | 1.88996260967E7 | 138.85 | 5.667346939 | Correlation | Status |

FIG. 15

| Plants count | Plants | | | Unclaimed notifications | Todays notifications |
|---|---|---|---|---|---|
| 15 | Critical 1 | Warning 3 | Acceptable 11 | 2 | 2 |

Search: Dashboards  Notifications  Assets  Motes  Settings

Recently viewed
Sterling
Lewes
Mitigation plan WR-23

Dashboards
-Plant portfolio overview

Sterling
Beachcastle
Oakheart
Saker keep
Valcarca
Black crystal
Lewes
Ballinamalard
Lanercoast
Lowkak
Murkwell
Stolzembourg
Coromina
Larnwick
Mansfield
Asset watchlist
+ Mitigation plans
+Divisions overview
Best & worst performing divisions
Supplier performance Dashboard > Plants portfolio overview

Global view

Plants by highest risk

Asst corrosion status (Asset count)

| Plants ▽ | △ Critical | ▨ Warning | ⬟ Acceptable |
|---|---|---|---|
| Sterling | 3 | 8 | 98 |
| Beach castle | 0 | 7 | 71 |
| Oakheart | 0 | 7 | 35 |
| Saker keep | 0 | 6 | 54 |
| Valcarca | 0 | 0 | 30 |
| Black crystal | 0 | 0 | 91 |
| Lewes | 0 | 0 | 18 |
| Ballinamalard | 0 | 0 | 19 |
| Lanercoast | 0 | 0 | 21 |
| Lowkak | 0 | 0 | 23 |
| Markwell | 0 | 0 | 19 |
| Stolzembourg | 0 | 0 | 21 |
| Coromina | 0 | 0 | 19 |
| Larnwick | 0 | 0 | 21 |
| Mansfield | 0 | 0 | 23 |

Edit
Save
Duplicate
Find similar assets

INDUSTRIAL ASSET INTELLIGENCE

RELATED APPLICATION

This application claims priority under 35 U.S.C. § 119(e) to U.S. Provisional Patent Application No. 62/559,625 filed on Sep. 17, 2017, and to U.S. Provisional Patent Application No. 62/716,064 filed on Aug. 8, 2018, the entire contents of each of which are hereby expressly incorporated herein.

BACKGROUND

An oil and gas production/processing facility (e.g., a refinery) can include equipment, which can perform processing and/or delivery of petroleum and natural gas-based resources (e.g., in order to recover, process, move, or produce products and prepare them for use or export). Processing of fuel can include a number steps including coking, hydrotreatment, alkylation, desulphidation, atmospheric distillation, reforming, waste water, vacuum distillation, and the like. These facilities can include pipelines for conveying liquids and gases between and within processing/production/delivery stages. But many of the materials (e.g., liquids and gases) utilized or created during the processing are corrosive and can cause the assets (e.g., equipment, pipes) to fail, such as when a section of pipe corrodes. Also, assets may fail due to normal wear and tear. Failure of assets can increase risk and can create unsafe conditions, which can ultimately reduce or even halt production and delivery of products.

SUMMARY

The current subject matter includes an interface that can provide improved visualization of data related to industrial assets. The visualizations can allow a user to quickly ascertain the status of an asset, such as the profile of corrosion within a pipe, without having to review detailed sensor data. In addition, the interface can enable visualizations of data that provide clear and intuitive representations of complex data. In some implementations, the current subject matter includes a non-intrusive method for the user. In some implementations, the interface can utilize a predictive model to predict the status of an asset into the future, for example, based on user input or actual conditions within the facility, thereby predicting a future status of an asset including time to failure (e.g., within a margin of error). Related apparatus, systems, techniques, and articles are also described.

In one implementation, a method can include receiving data identifying an industrial asset. The method can also include receiving data characterizing one or more sensors configured to detect a first property of the asset. The method can further include determining a first graphical representation of the asset based on the received data identifying the industrial asset, and a second graphical representation of a first sensor of the one or more sensors based on the received data characterizing one or more properties of one or more sensors. The method can further include rendering, in a graphical display space, the first graphical representation and the second graphical representation. One or more visual properties of the second graphical representation can be indicative of one or more properties of the first sensor and/or the detected first property of the asset. A position of the second graphical representation in the graphical display space relative to the first graphical representation can be indicative of a first location of the first sensor on the asset.

One or more of the following features can be included in any feasible combination.

In one implementation, the method can further include receiving a first user input indicative of a selection of the first sensor. The method can also include determining a third graphical representation of a cross-section of the asset at the first location. The third graphical representation can be indicative of one or more sensor element locations of one or more sensor elements of the first sensor on the cross-section of the asset. The method can further include rendering the third graphical representation in the graphical display space.

In another implementation, the method can further include receiving a second user input indicative of a selection of a first sensor element of the one or more sensor elements. The method can also include determining a first plot indicative of the first property of the asset and detected by the first sensor element at a first sensor element location of the one or more sensor element locations. The method can further include rendering the first plot in the graphical display space.

In one implementation, the method can further include receiving a third user input indicative of a selection of a second sensor element of the one or more sensor elements. The method can also include determining a second plot indicative of the first property of the asset and detected by the second sensor element at a second sensor element location of the one or more sensor element locations. The method can further include rendering the second plot in the graphical display space. The second plot can be superimposed on the first plot.

In another implementation, the method can further include receiving a fourth user input indicative of selection of a second sensor of the one or more sensors, the second sensor located at a second location on the asset. The method can also include determining a fourth graphical representation of a second cross-section of the asset at the second location. The fourth graphical representation can be indicative of one or more sensor element locations of one or more sensor elements of the second sensor on the second cross-section of the asset. The method can further include rendering the fourth graphical representation in the graphical display space.

In one implementation, the one or more visual properties of the second graphical representation can include a color of the second graphical representation indicative of the first property of the industrial asset detected by the first sensor. In another implementation, the one or more visual properties of the second graphical representation can include an opacity of the second graphical representation indicative of a corrosion rate associated with the industrial asset detected at the first location detected by the first sensor. In yet another implementation, the first property can include a wall thickness of the asset.

In one implementation of the method, a dashboard can be configured to receive data identifying the industrial asset. In another implementation, a digital model system can be configured to receive data characterizing one or more sensors configured to detect the first property of the asset. The digital model system can also be configured to determine the first graphical representation of the asset based on the received data identifying the industrial asset, and the second graphical representation of the first sensor of the one or more sensors based on the received data characterizing one or more properties of one or more sensors. The digital model system can further be configured to communicate data charactering the first graphical representation and the second graphical representation to the dashboard. The dashboard can be configured to render data characterizing the first graphical representation and the second graphical representation in the graphical display space.

In one implementation, a system can include at least one data processor, and memory coupled to the at least one data processor. The memory can store instructions to cause the at least one data processor to perform operations including receiving data identifying an industrial asset. The operations can also include receiving data characterizing one or more sensors configured to detect a first property of the asset. The operations can further include determining a first graphical representation of the asset based on the received data identifying the industrial asset, and a second graphical representation of a first sensor of the one or more sensors based on the received data characterizing one or more properties of one or more sensors. The operations can further include rendering, in a graphical display space, the first graphical representation and the second graphical representation. One or more visual properties of the second graphical representation can be indicative of one or more properties of the first sensor and/or the detected first property of the asset. A position of the second graphical representation in the graphical display space relative to the first graphical representation can be indicative of a first location of the first sensor on the asset.

One or more of the following features can be included in any feasible combination.

In one implementation, the operations can further include receiving a first user input indicative of a selection of the first sensor. The operations can also include determining a third graphical representation of a cross-section of the asset at the first location. The third graphical representation can be indicative of one or more sensor element locations of one or more sensor elements of the first sensor on the cross-section of the asset. The operations can further include rendering the third graphical representation in the graphical display space.

In one implementation, the operations can further include receiving a third user input indicative of a selection of a second sensor element of the one or more sensor elements. The operations can also include determining a second plot indicative of the first property of the asset and detected by the second sensor element at a second sensor element location of the one or more sensor element locations. The operations can further include rendering the second plot in the graphical display space. The second plot can be superimposed on the first plot.

In another implementation, the operations can further include receiving a fourth user input indicative of selection of a second sensor of the one or more sensors, the second sensor located at a second location on the asset. The operations can also include determining a fourth graphical representation of a second cross-section of the asset at the second location. The fourth graphical representation can be indicative of one or more sensor element locations of one or more sensor elements of the second sensor on the second cross-section of the asset. The operations can further include rendering the fourth graphical representation in the graphical display space.

In one implementation, the one or more visual properties of the second graphical representation can include a color of the second graphical representation indicative of the first property of the industrial asset detected by the first sensor. In another implementation, the one or more visual properties of the second graphical representation can include an opacity of the second graphical representation indicative of a corrosion rate associated with the industrial asset detected at the first location detected by the first sensor. In yet another implementation, the first property can include a wall thickness of the asset.

In one implementation of the operations, a dashboard can be configured to receive data identifying the industrial asset. In another implementation, a digital model system can be configured to receive data characterizing one or more sensors configured to detect the first property of the asset. The digital model system can also be configured to determine the first graphical representation of the asset based on the received data identifying the industrial asset, and the second graphical representation of the first sensor of the one or more sensors based on the received data characterizing one or more properties of one or more sensors. The digital model system can further be configured to communicate data characterizing the first graphical representation and the second graphical representation to the dashboard. The dashboard can be configured to render data characterizing the first graphical representation and the second graphical representation in the graphical display space.

These and other capabilities of the disclosed subject matter will be more fully understood after a review of the following figures, detailed description, and claims.

BRIEF DESCRIPTION OF THE FIGURES

These and other features will be more readily understood from the following detailed description taken in conjunction with the accompanying drawings, in which:

FIG. 11 illustrates an example log tab;

FIG. 12 illustrates an example A-scans tab

FIG. 15 illustrates an example inspection report according to some implementations;

FIG. 17 illustrates an example overview of all monitored plants and a list summarizing plants and ordered according to a measure of risk;

FIG. 18 illustrates an overview of a fuel plant, the status of the monitored assets, and the status of various components of the hardware monitoring system;

FIG. 21 illustrates an exemplary bi-directional connectivity between an edge device and a cloud platform including a digital model engine, dashboard, and the like;

FIG. 30 illustrates an example context menu according to some implementations of the current subject matter;

FIG. 34 illustrates the interface of FIG. 32 having a vertical forecast taskbar.

DETAILED DESCRIPTION

In order to monitor industrial equipment (e.g., assets), sensors can be attached to or included in the equipment. For example, a pipe may include an ultrasound transducer that can measure a thickness of the pipe at a specific location (and thus measure the level of corrosion and change in thickness over time, for example). These sensors can provide measurements to a centralized service in the cloud for a user, such as a plant manager, to review and identify problems with assets so the plant manager may take corrective action before the asset fails. But industrial facilities such as a fuel production plant may include thousands of sensors providing data for review. Given the significant amount of data collected and provided by these sensors, it can be difficult for a user to review this data in a meaningful way. This can make it challenging to identify problems and take action. The current subject matter can include an interface that provides improved visualization of data related to industrial assets. The visualizations can allow a user to quickly determine the status of an asset, such as the profile of corrosion within a pipe, without having to review detailed sensor data. In addition, the interface can enable visualizations of data that provide clear and intuitive representations of complex data. In some implementations, the interface can utilize a predictive model to predict the status of an asset into the future, for example, based on user input or actual conditions within the facility, thereby predicting a future status of an asset including time to failure. Other embodiments are within the scope of the disclosure.

Figure 1:
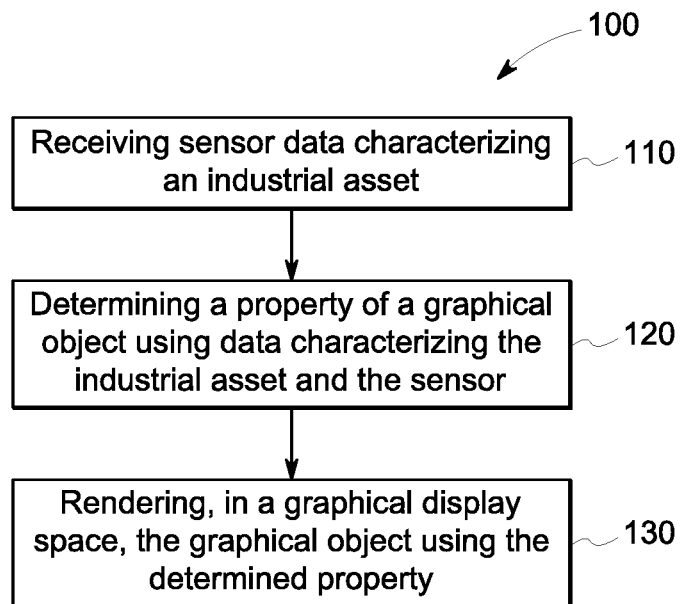
FIG. 1 is a process flow diagram illustrating an example process of visualizing data of an asset according to the current subject matter.

FIG. 1 is a process flow diagram illustrating an example process 100 of visualizing data of an asset according to the current subject matter. In some implementations, the visualization can allow a user to quickly ascertain the status of an asset, such as the profile of corrosion within a pipe, without having to review detailed sensor data. The visualization can provide a clear and intuitive representation of complex data.

At 110, sensor data is received (e.g., from a sensor configured to detect one or more properties of the industrial asset, a device [e.g., router] that acts as an intermediary between the sensor and a computing device configured to determine properties associated with the industrial asset, etc.). The sensor data can relate to an industrial asset, for example, a pipe, a machine (such as a pump or valve), and the like. The sensor can include any device that detects and/or measures a physical property of the asset. For example, a pipe may include one or more sensors measuring wall thickness (e.g., ultrasound sensor, electromechanical sensor, transducer, and the like), temperature, pressure, and the like. In some implementations, the sensor can be active and/or passive. In some implementations, a sensor can include multiple sensing elements such that the sensor can generate multiple measurements from different points, such as different points on a pipe. Sensors that can produce measurements at more than one point and/or that include multiple sensing elements can be referred to as sectors, sensor arrays, and the like. Other sensors/transducers are possible.

At 120, a property of a graphical object can be determined (e.g., by a computing device configured to receive sensor data at step 110 and determined properties associated with the industrial asset) using the received sensor data and information regarding the sensor. For example, a graphical object can include a representation of the asset and sensor. The graphical object can include an indicator for the sensor and properties such as position, orientation, and color of the indicator can reflect properties of the sensor and/or sensor measurement.

Figure 2:
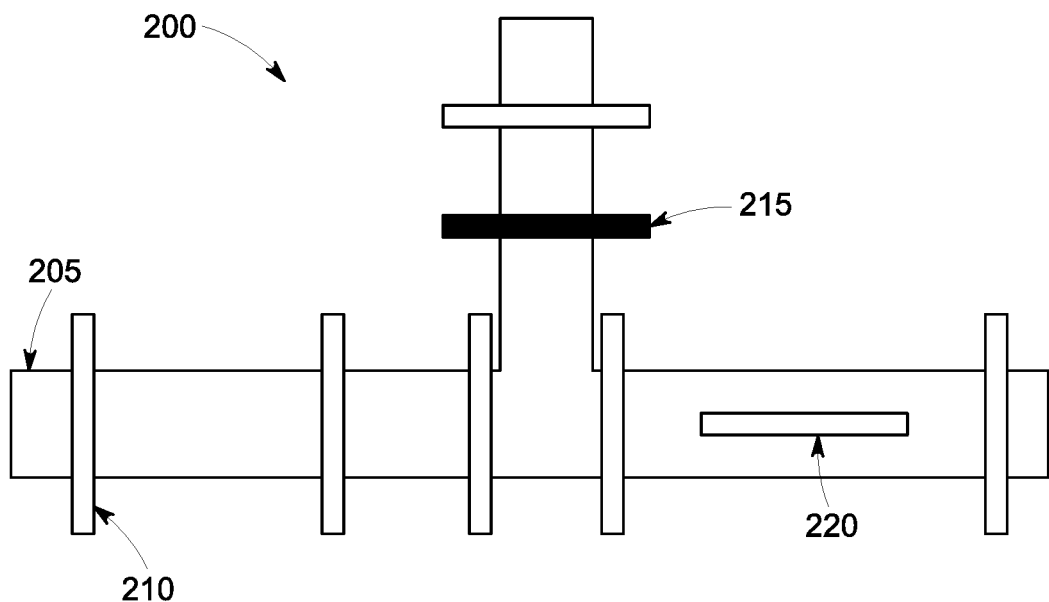
FIG. 2 is an example graphical object according to some aspects of the current subject matter.

FIG. 2 is an example graphical object 200 according to some aspects of the current subject matter. The exemplary graphical object 200 includes a representation of the asset 205, in this case, a T-junction pipe. The representation of the asset 205 can be based on a database of known asset types. The graphical object 200 can include an indicator 210 related to the sensor and having properties whose values correspond to information about the sensor and/or asset. The indicator 210 can be a multi-condition icon in that multiple properties and/or conditions of the asset and/or sensor can be represented/visualized using a single icon. Using a single icon, multiple pieces of information can be represented by position, orientation, color, and opacity. Using a multi-condition icon can provide an at-a-glance way of seeing multiple pieces of information with a single icon.

The indicator 210, in this example, is a line having properties that reflect information about the sensor and associated sensor measurements. In the example, the line indicates that the sensor is a strip that encircles the asset. The indicator 210 includes a position, an orientation, a color, and an opacity.

The position of the indicator 210 on the representation of the asset 205 can correspond to a location of the sensor (and/or set of sensors, also referred to as a section of sensors) on the asset. For example, the position of the indicator 210 can be different than the position of a second indicator 215, which can be associated with a second sensor. The different positions of the indicators 210, 215 on the representation of the asset 205 can reflect the different locations of the sensors on the asset. For example, the sensor associated with indicator 210 can be located on a first leg of the T-junction asset and the sensor associated with indicator 215 can be located on a second leg of the T-junction asset.

The orientation of the indicator 210 on the representation of the asset 205 can correspond to an orientation of the sensor on the asset. For example, the orientation of indicator 210 can be different than the orientation of a third indicator 220, which is associated with a third sensor. The different orientations of the indicators 210, 220 on the representation of the asset 205 can reflect the different orientations of the sensors on the asset. For example, the sensor associated with indicator 210 can be arranged in a band encircling the asset (e.g., pipe, in this example) and the sensor associated with indicator 220 can be a strip laying horizontally (longitudinally) along the outside of the asset (e.g., pipe, in this example).

The color of the indicator 210 on the representation of the asset 205 can correspond to a property of the asset and/or sensor measurement associated with the sensor. For example, the color of indicator 210 can be different than the color of indicator 215, which is associated with a different sensor (or section of sensors). The different colors of indicators 210, 215 on the representation of the asset 205 can reflect a difference in a property of the asset and/or sensor measurement. For example, indicator 210 can be colored blue to indicate that the asset wall at that sensor location is an acceptable thickness and/or corrosion rate. Indicator 215 can be colored yellow to indicate that the asset wall at that sensor location is below an acceptable thickness (and/or corrosion rate) and may fail in the near future. Other colors and status can be used. For example, red can indicate that the asset is at or near a failure condition. Light blue can indicate a slower rate of corrosion.

The opacity of the indicator 210 on the representation of the asset 205 can correspond to a property of the asset and/or sensor measurement associated with the sensor. For example, the opacity of indicator 210 can be different than the opacity of indicator 215, which is associated with a different sensor (or section of sensors). The different opacities of indicators 210, 215 on the representation of the asset 205 can reflect a difference in a property of the asset and/or sensor measurement. For example, indicator 210 can have a first opacity level to indicate that the corrosion rate at that sensor location is at a first value. Indicator 215 can have a second opacity level to indicate that the asset wall at that sensor location is at a second value. Other opacity values and status can be used.

Referring again to FIG. 1, at 130, the graphical object can be rendered in a graphical display space using the determined property. For example, the example graphical object illustrated in FIG. 2 can be rendered in a graphical display space, such as in a user interface. For example, the graphical object can be rendered in an application executed by a user computing device (e.g., laptop, tablets, cell phone, etc.).

Figure 3:
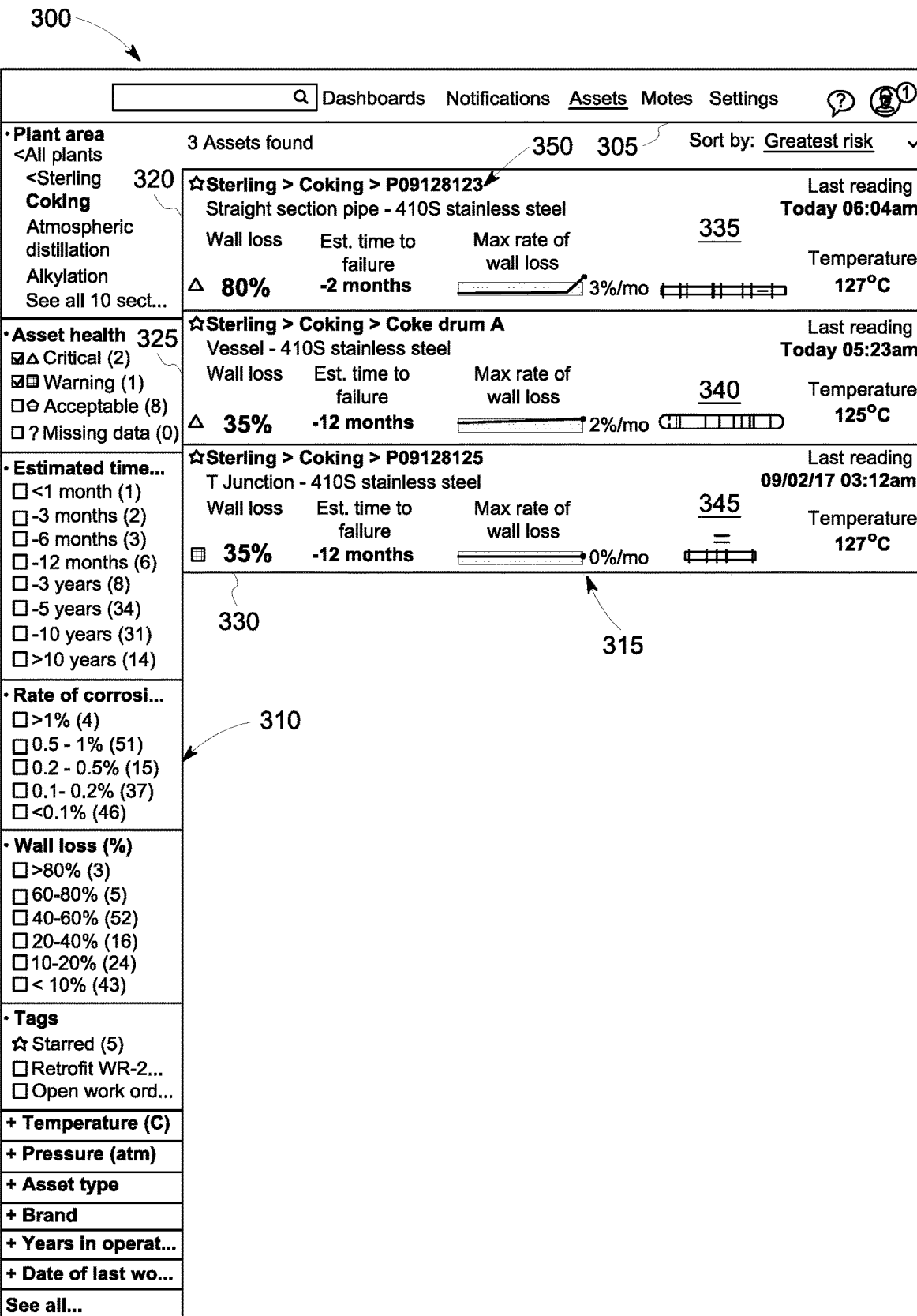
FIG. 3 is an example of an interface that can allow a user to quickly ascertain the status of an asset, such as the profile of corrosion within a pipe, without having to review detailed sensor data.

In some implementations, the graphical object can be rendered in an interface for predictive corrosion management. FIG. 3 is an example of an interface 300 that can allow a user to quickly ascertain the status of an asset, such as the profile of corrosion within a pipe, without having to review detailed sensor data. The interface 300 can provide a clear and intuitive representation of complex sensor data, for example, by presenting the graphical representation that can be indicative of the industrial asset, sensor properties, etc. Interface 300 can be implemented as a cloud-based service (e.g., software application).

Exemplary interface 300 can provide insight, management, and control over a large number of assets including over assets from different industrial facilities. Interface 300 can be a cloud based service.

Exemplary interface 300 includes a menu bar 305 with tabs, a vertical taskbar 310, and a data panel 315. The menu bar 305 includes tabs for accessing different modules within the interface 300. The vertical taskbar 310 implements a faceted search for searching through available assets and filtering on facets of the asset. The data panel 315 can show results of the faceted search listing assets and brief summaries of data related to the asset. In the example of FIG. 3, there are three list entries 320, 325, and 330. Each list entry includes the name of the asset, a brief description of the asset, percent wall loss, estimated time to failure, maximum rate of wall loss, time of last wall-thickness sensor reading, temperature, and a graphical object representing the asset (335, 340, and 345, respectively). The graphical objects can be referred to as spark line objects or graphs. By including these graphical objects in search result lists, the current subject matter can allow a user to quickly ascertain the status of an asset, such as the profile of corrosion within a pipe, without having to review detailed sensor data. This can provide a clear and intuitive representation of complex sensor data.

Figure 4A:
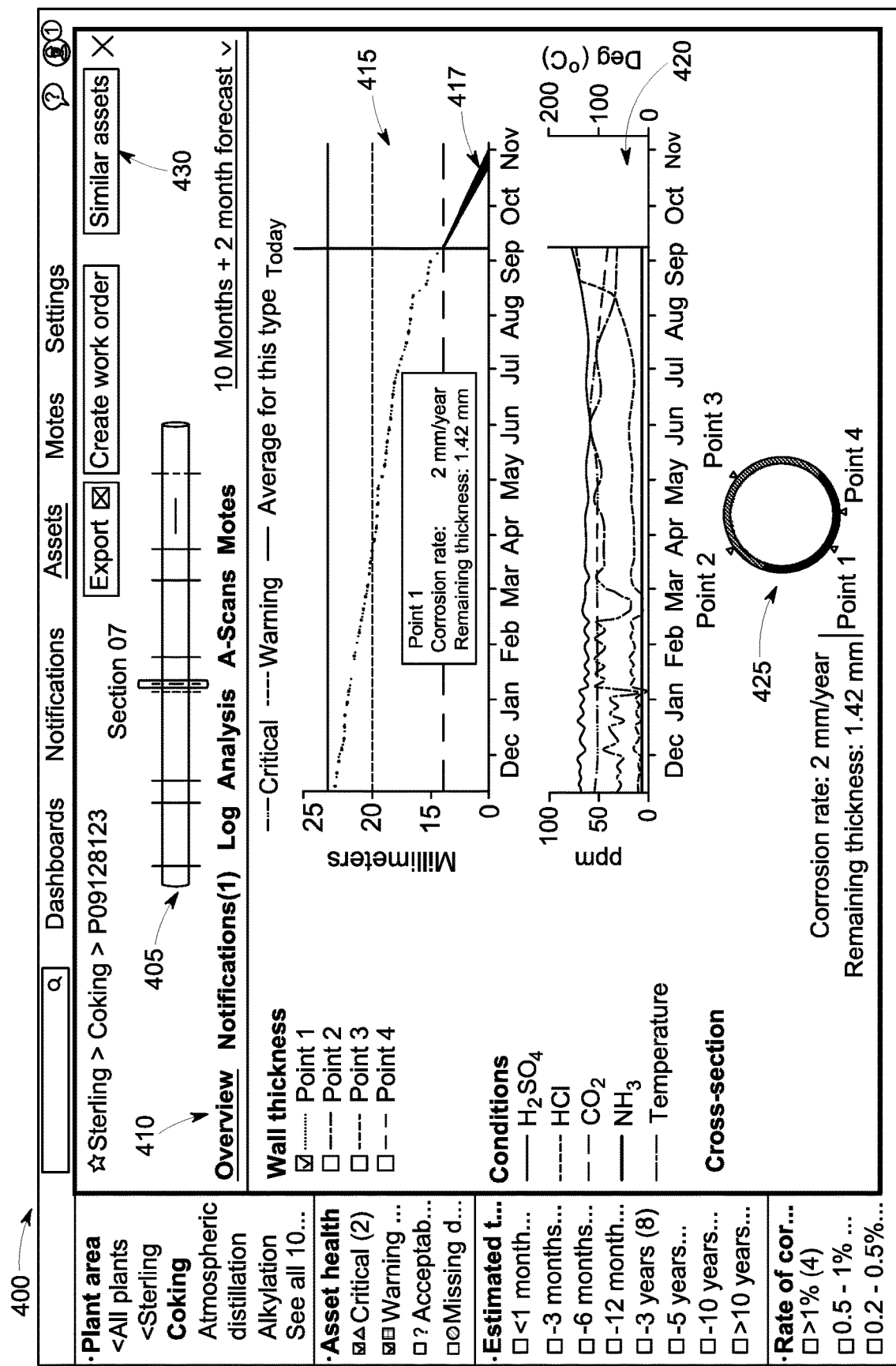
FIG. 4A illustrates an interface with a window showing details of the selected asset within an overview tab.
Figure 4B:
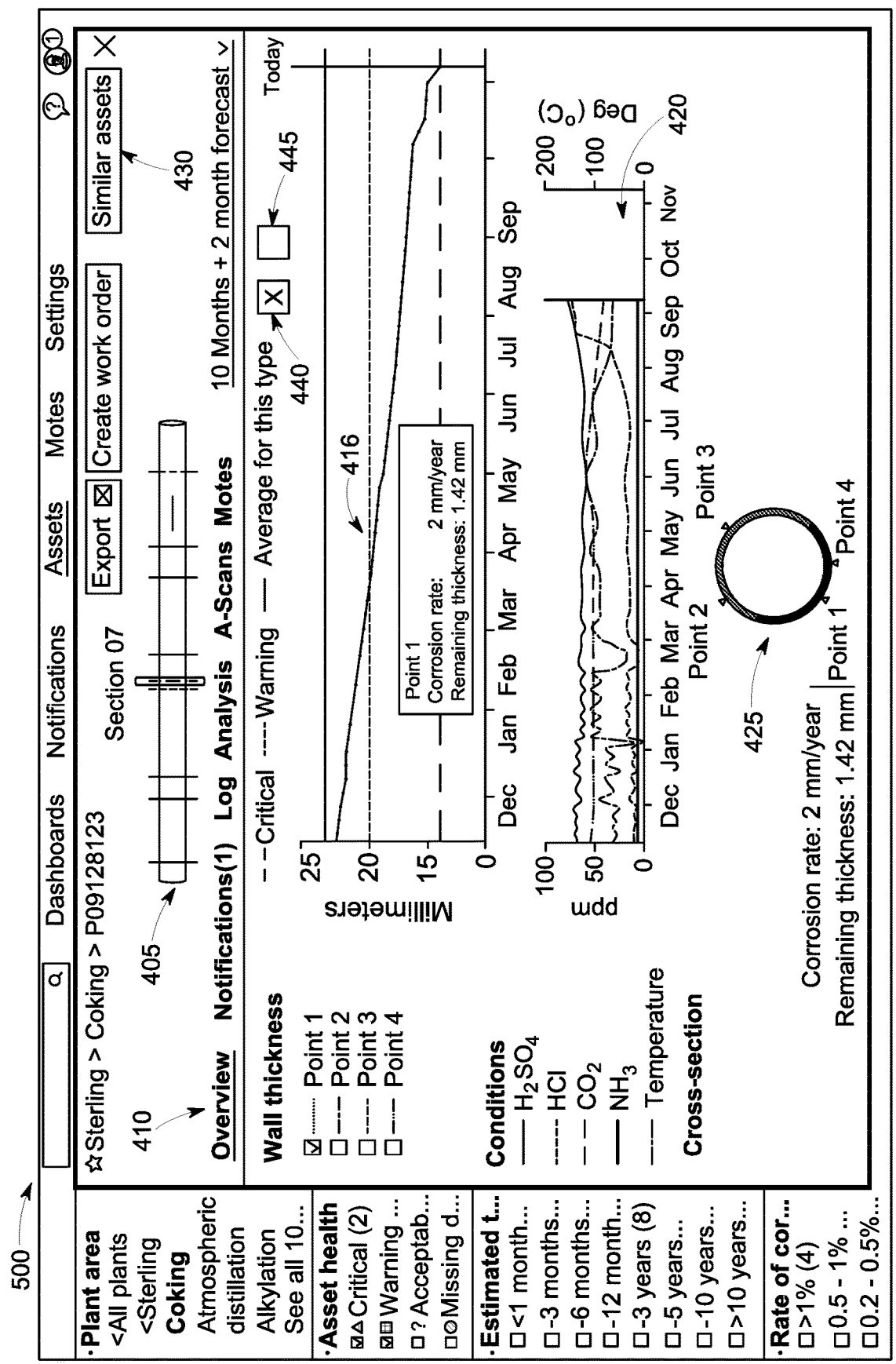
FIG. 4B illustrates an interface with a window displaying a detection data plot of the selected asset.
Figure 4C:
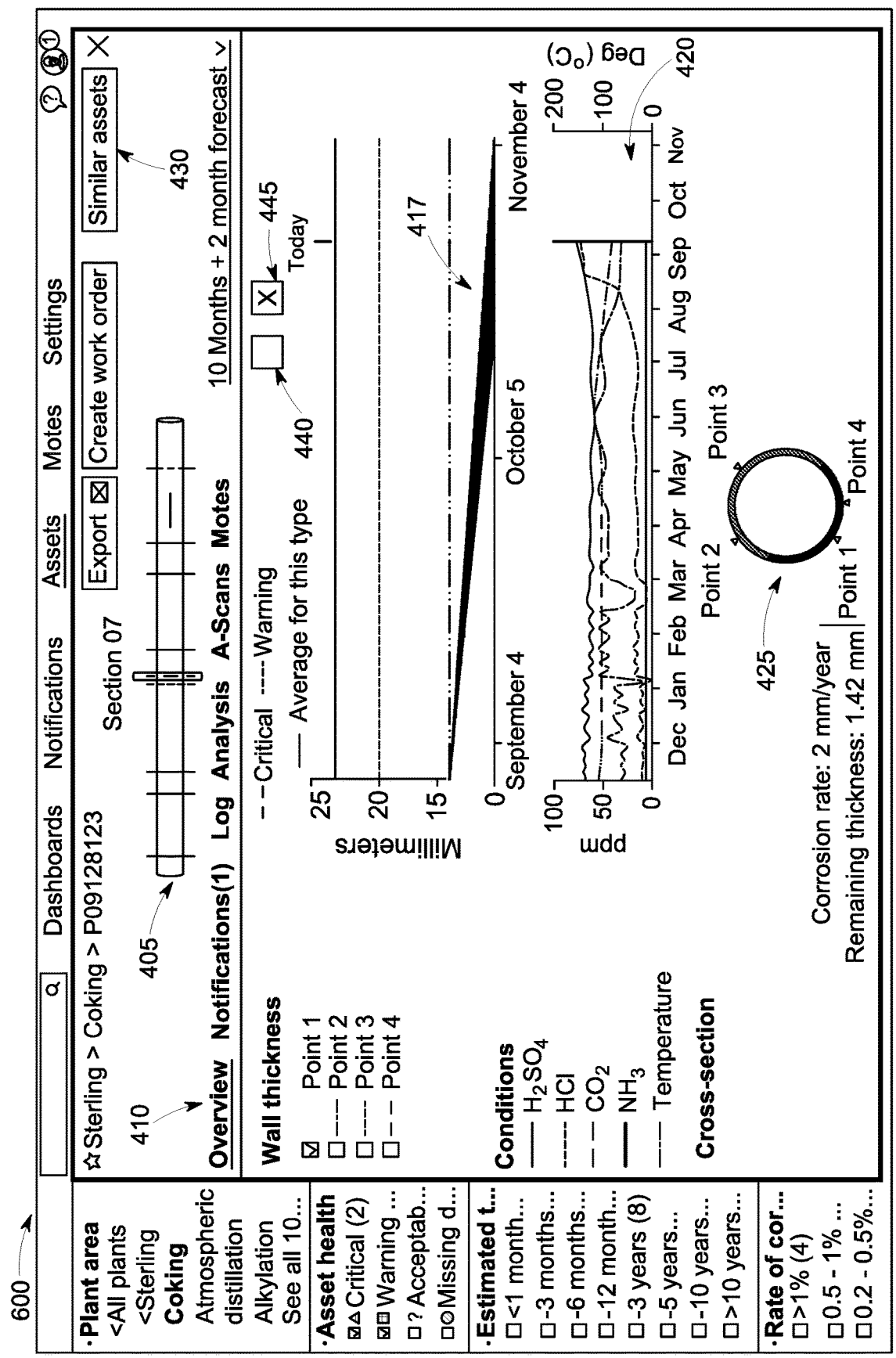
FIG. 4C illustrates an interface with a window displaying a prediction data plot of the selected asset.

By clicking on the asset name (for example, at 350), the interface can, as illustrated in FIG. 4, display a window 400 showing details of the selected asset within an overview tab. The window 400 can include an interactive graphical object 405, a menu bar 410 with tabs (overview tab is illustrated in FIG. 4), and data visualization elements 415, 420, 425.

Interactive graphical object 405 can include a spark line object similar to the one described above, including a wireframe representation of the asset and multiple indicators. The interactive graphical object 405 can allow a user to select the indicators, which can cause the data visualization elements 415, 420, 425 to update with data related to the sensor associated with that indicator.

Data visualization element 415 can include a plot of detected sensor data over time 416 ("detection plot"). In the example of FIG. 4, wall thickness over time is illustrated. In the example, the sensor is a linear array of ultrasound sensors located around the circumference of the asset (e.g., pipe). Each sensor can return a measurement at four points around the circumference. Wall thickness at each point can be displayed in data visualization element 415.

In some implementations, data visualization element 415 can include a plot of predicted future values over time 417 ("prediction plot"). Predicted future values 417 can be generated by a predictive model that predicts, based on the past conditions, proposed future conditions, physics models, probabilistic machine learning algorithms, and/or sensor measurements, how the illustrated data will change over time. In the example of FIG. 4, wall thickness is predicted. As illustrated the thickness of the line illustrating predicted future values 417 indicates a probability (e.g., confidence or standard deviation) associated with the prediction. In FIG. 4, the line expands in thickness over time indicating that the predicted value is likely to fall within a larger range of values (e.g., a cone of uncertainty), and the logic determining the line's thickness (e.g., uncertainty) over time may be determined by a variety of methods.

Data visualization element 420 can include a plot of conditions over time. In the example of FIG. 4, concentrations of materials (e.g., contained in the material passing through the pipe) and temperature at the sensor location are illustrated. The conditions can be provided by sensors, input by user, and/or provided as the output of a digital model of the asset or one or more different assets within the facility. In some implementations, the digital model can include a physical and ionic model of corrosion.

Data visualization element 425 can include another graphical model of the asset illustrating a cross section of the asset at the location of the selected sensor. Data visualization element 425 can include indicators (for example, similar to those discussed with reference to FIGS. 1 and 2), which, in this example, indicate positions or points of each sensor measurement. For example, a user can select a particular sensor in interactive graphical object 405 and data visualization element 425 will be updated to illustrate the cross-sectional view of the sensor. This can provide additional information around the circumference of the pipe that may not be available in interactive graphical object 405.

In some implementations, the data visualization element 425 is another interactive graphical object. In some implementations, a user can select each point, which can cause data visualization element 415 to update with data from that point or remove already plotted data, similar to selecting/unselecting the respective point checkbox in data visualization element 415. The color of the interactive graphical object can vary throughout and correspond to a property of the asset and/or sensor measurement associated with the sensor. For example, the interactive graphical object illustrates that regions of the cross-section near point 1 and 4 are red whereas regions near point 2 and 3 are blue. The red color can indicate that asset wall thickness is below an acceptable level and failure is likely to occur or has already occurred.

Figure 5:
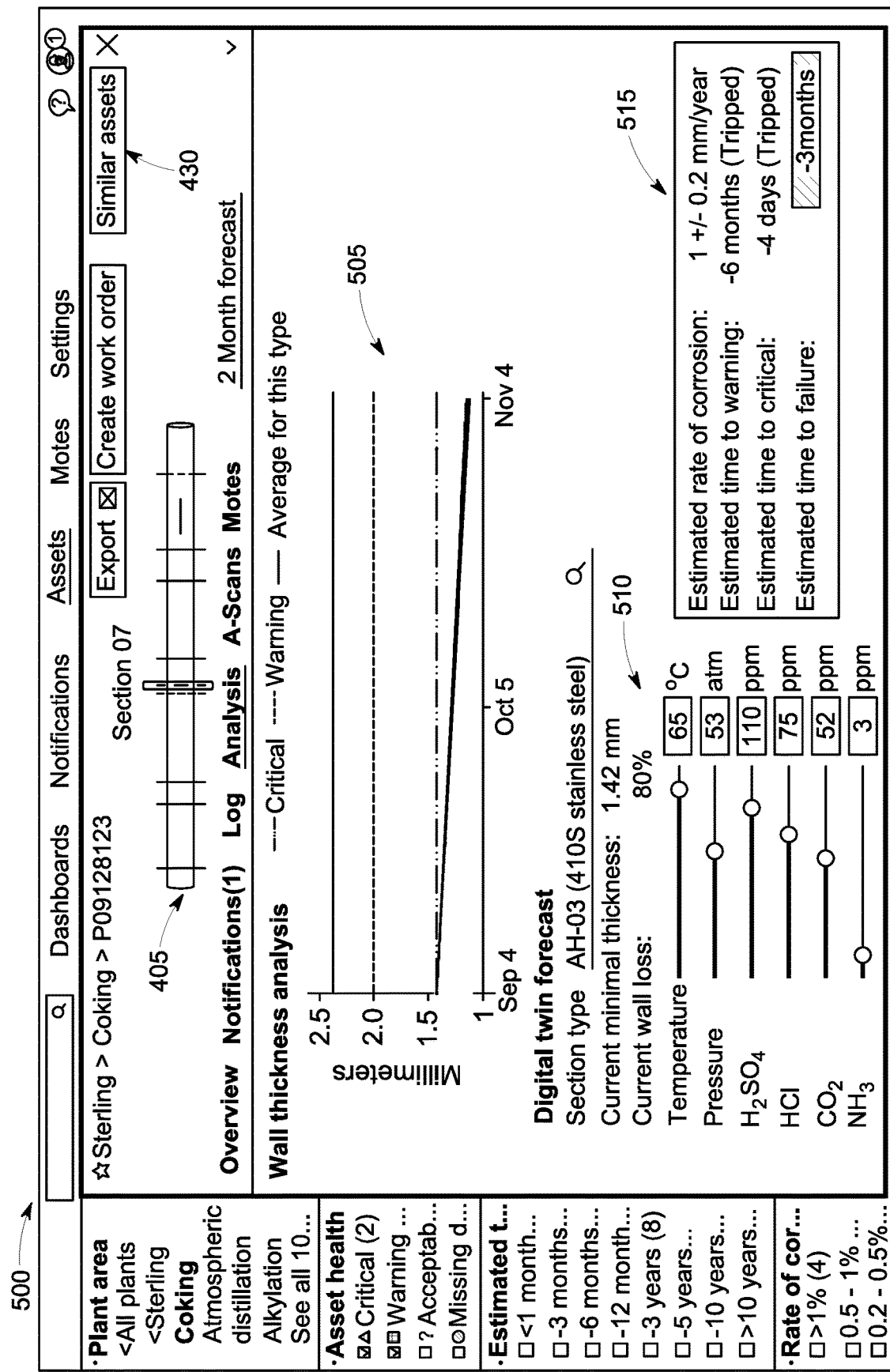
FIG. 5 illustrates an example analysis tab.
Figure 6:
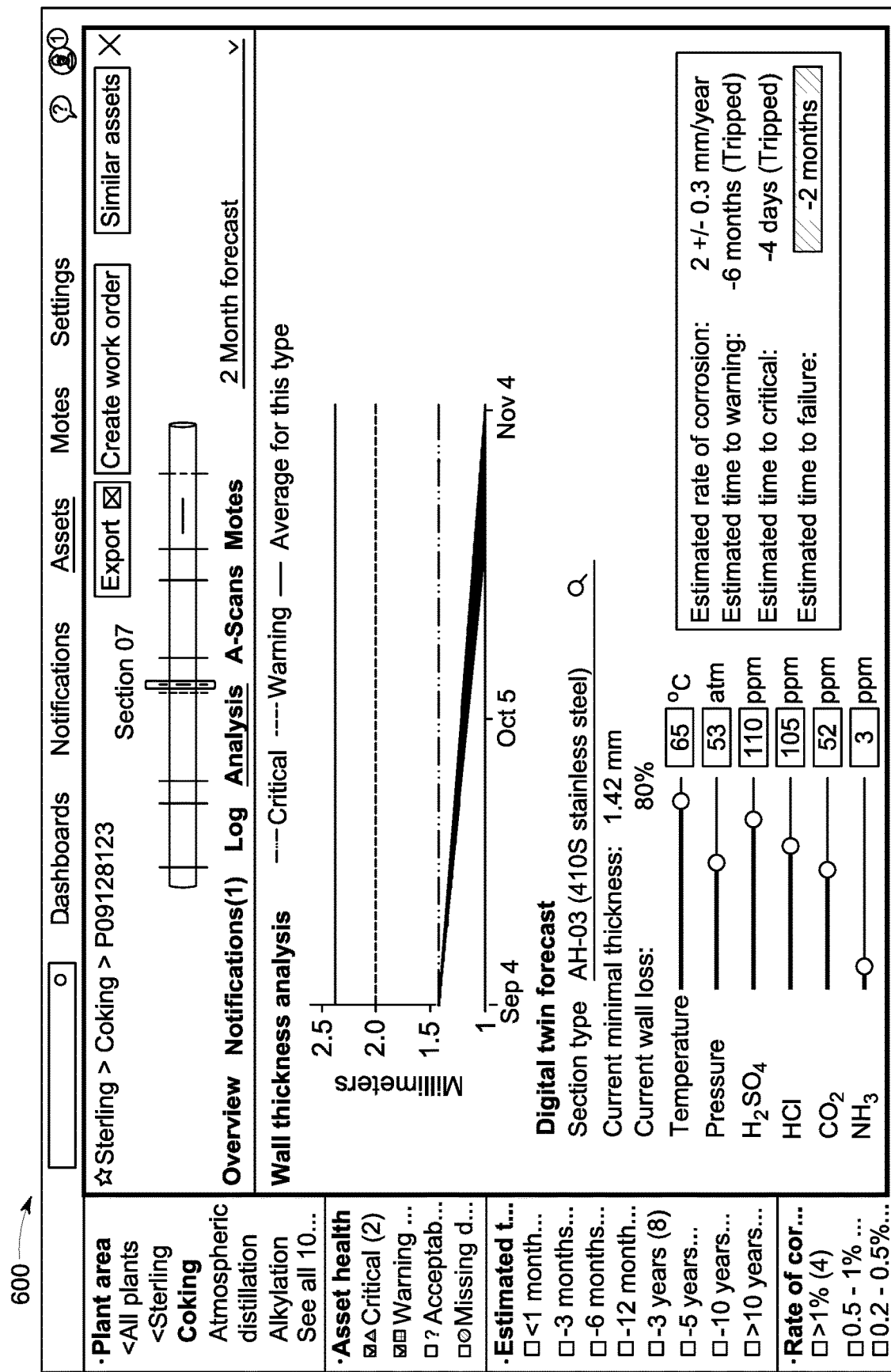
FIG. 6 illustrates an updated analysis tab where the inputs have been changed.

A user can toggle among the detection plot 416, the prediction plot 417 and the combined plot that includes both the detection plot 416 and the prediction plot 417. A user can toggle among the plots, for example, by selecting one or more of the detection plot icon 440 and prediction plot icon 445. As illustrated in FIG. 4, both the detection plot icon 440 and prediction plot icon 445 have been selected. As a result, both the detection plot 416 and the prediction plot 417 have been presented in the data visualization element 415. FIG. 5 illustrates a display window 500 where only the detection plot icon 440 is selected. As a result, only the detection plot 416 is presented in the data visualization element 415. FIG. 6 illustrates a display window 600 where only the detection plot icon 440 is selected. As a result, only the prediction plot 417 is presented in the data visualization element 415. A user can switch between the display windows in FIGS. 4, 5 and 6 by clicking on one or more of the icons 440 and 445.

In some implementations, toggling between plots of the detection data, prediction data or both (e.g., FIGS. 5, 6 and 4, respectively) the size of the plots can be changed. The size of the plots can be automatically varied to occupy a predetermined portion of the data visualization element 415. For example, when toggling from the combined plot in FIG. 4 to the detection plot in FIG. 5 (e.g., unselecting prediction plot icon 445), the detection plot 416 can be enlarged within the visualization element 415. In another example, when toggling from the combined plot in FIG. 4 to the prediction plot 417 in FIG. 6 (e.g., unselecting detection plot icon 440), the prediction plot 417 can be enlarged within the visualization element 415. When both the detection plot icon 440 and the prediction plot icon 445 are selected, the plots 416 and 417 can be simultaneously presented. For example, the time axes of the detection plot 416 and the prediction plot 417 can be aligned into a single combined time axis. The time axis of the detection plot 416 can represent a first time duration (e.g., time duration of detection of asset properties by a sensor) and the time axis of the selection plot 417 can represent a second time duration (e.g., time duration over which the prediction model has performed the predictive simulation). The first and the second time durations can be temporally contiguous. In some implementations, the detection plot 416 and the prediction plot 417 can be separated by a vertical line 455 which can be indicative of the time of the creation of the plots.

In some implementations, the detection plot 416 and prediction plot 417 can be implemented using GUI control widgets (e.g., separate GUI widgets for the detection plot 416 and the prediction plot 417). Operation of the GUI control widgets (e.g., GUI widgets associated with detection plot 416 and the prediction plot 417) can be independent of each other. For example, the detection plot widget can access detection data and can generate the detection plot 416, and the prediction plot widget can access prediction data and can generate the prediction plot 417. In some implementations, a user can interact (e.g., by clicking) with the detection/prediction plot widget. For example, the user can magnify a portion of the detection plot 416 (or prediction plot 417) in the detection plot widget (or prediction plot widget). In some implementations, the size of the detection/prediction plot widget can vary in size in the visualization element 415 based on user input via the detection plot icon 440 and/or prediction plot icon 445.

A user can select the analysis tab in the menu bar 410, which causes the interface to change tabs to the analysis tab. FIG. 5 illustrates an example analysis tab 500. The analysis tab 500 can include data visualization elements 505, 515, and an interactive element 510 for interacting with a digital model of the asset. Data visualization element 505 can include a plot of the predicted future values over time (e.g., similar to those described with reference to FIG. 4). Data visualization element 515 is illustrated as a table showing certain predictions. In the example of FIG. 5, estimated rate of corrosion, time to warning, time to critical, and time to failure are illustrated.

Interactive element 510 can include elements for specifying the inputs (e.g., conditions) for predicting the future values. The inputs can be utilized by a predictive model including a digital model of the asset, to predict future values. In FIG. 5, the inputs can be specified either directly, through an editable text field, or using a slider object. Other implementations are possible, such as the automatic or manual ingestion of the values from an application programming interface (API), a file upload, or other automated data loading or access technique. When inputs are specified (e.g., changed), the predictive model can update and new future values can be displayed.

Figure 27:
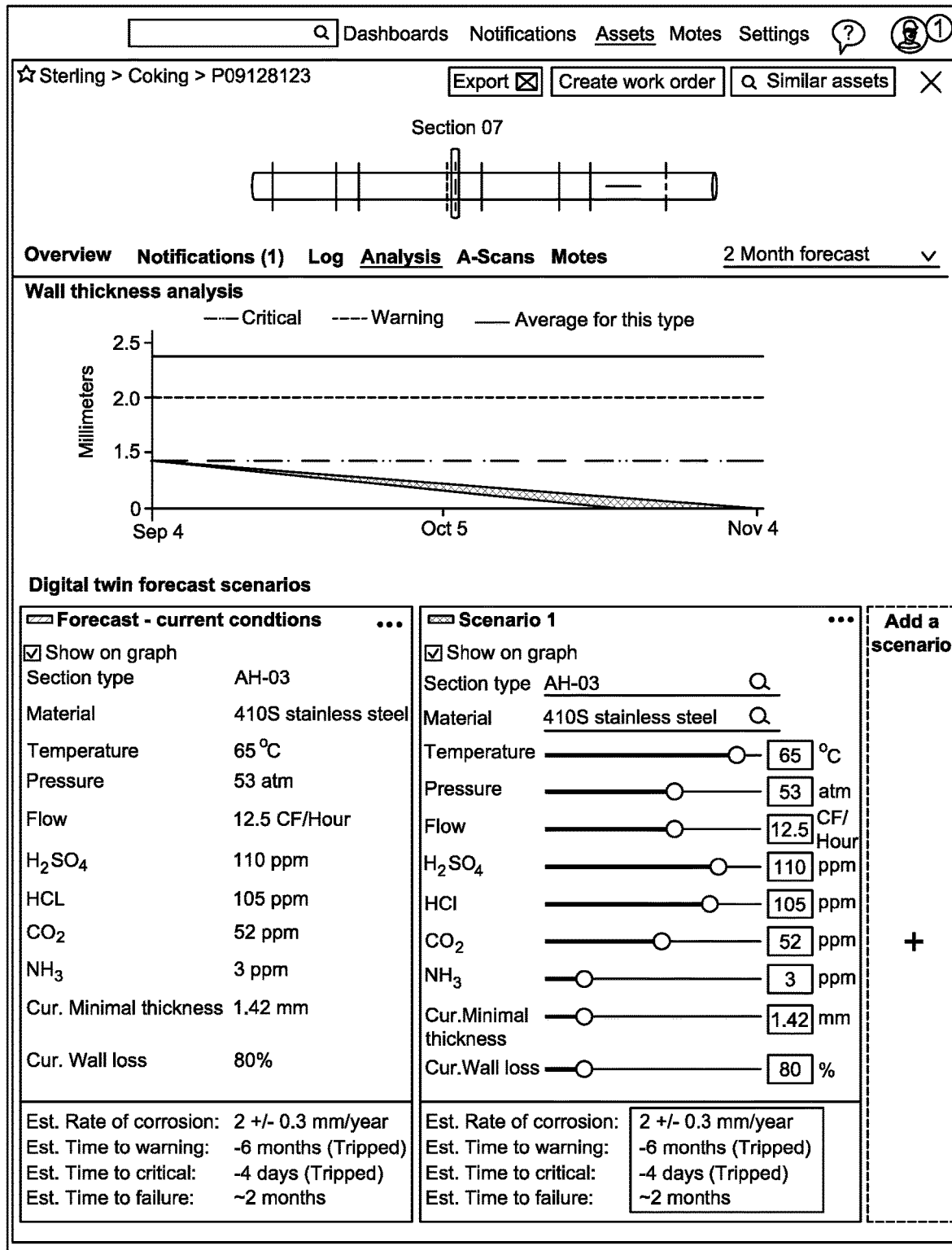
Figure 28:
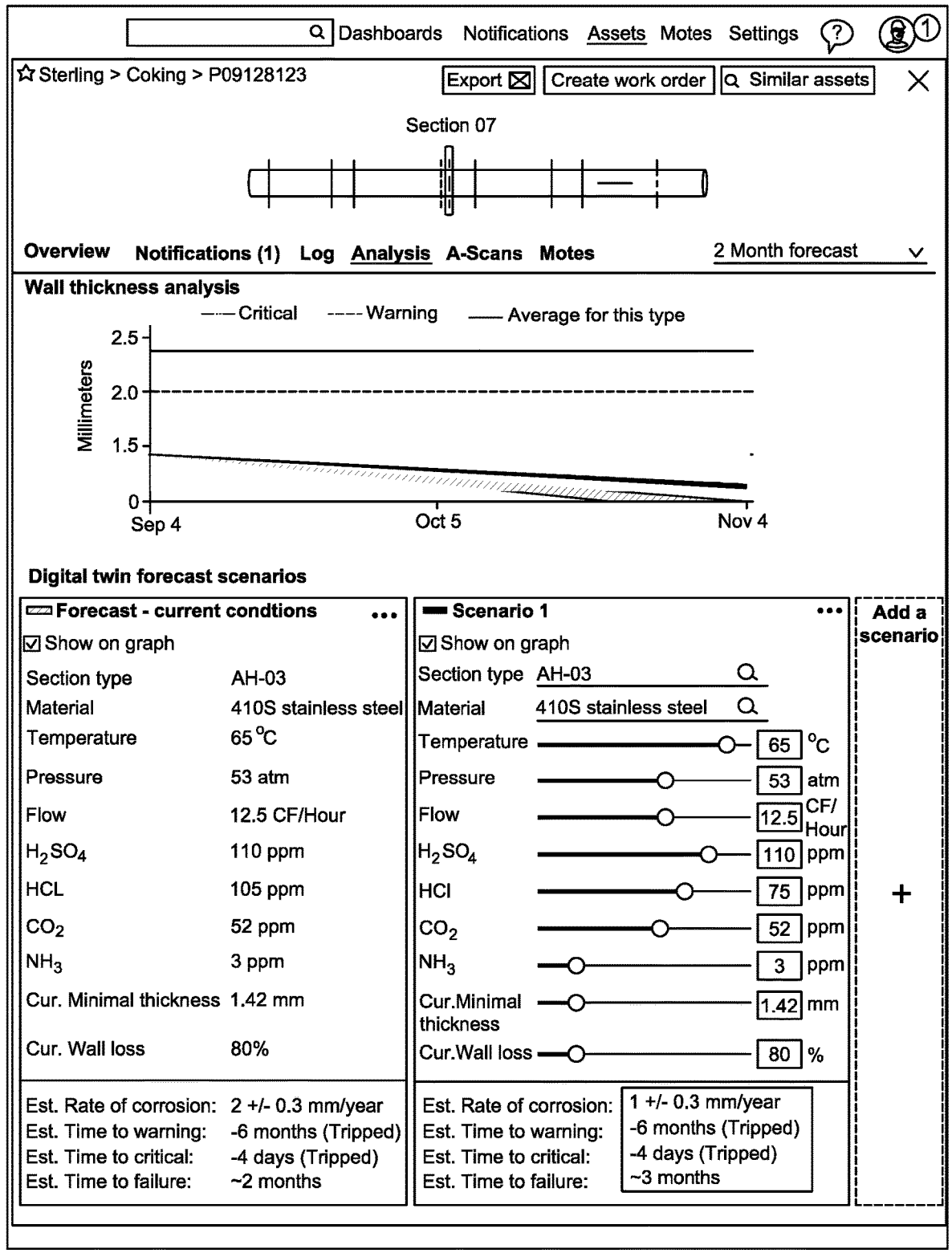
Figure 29:
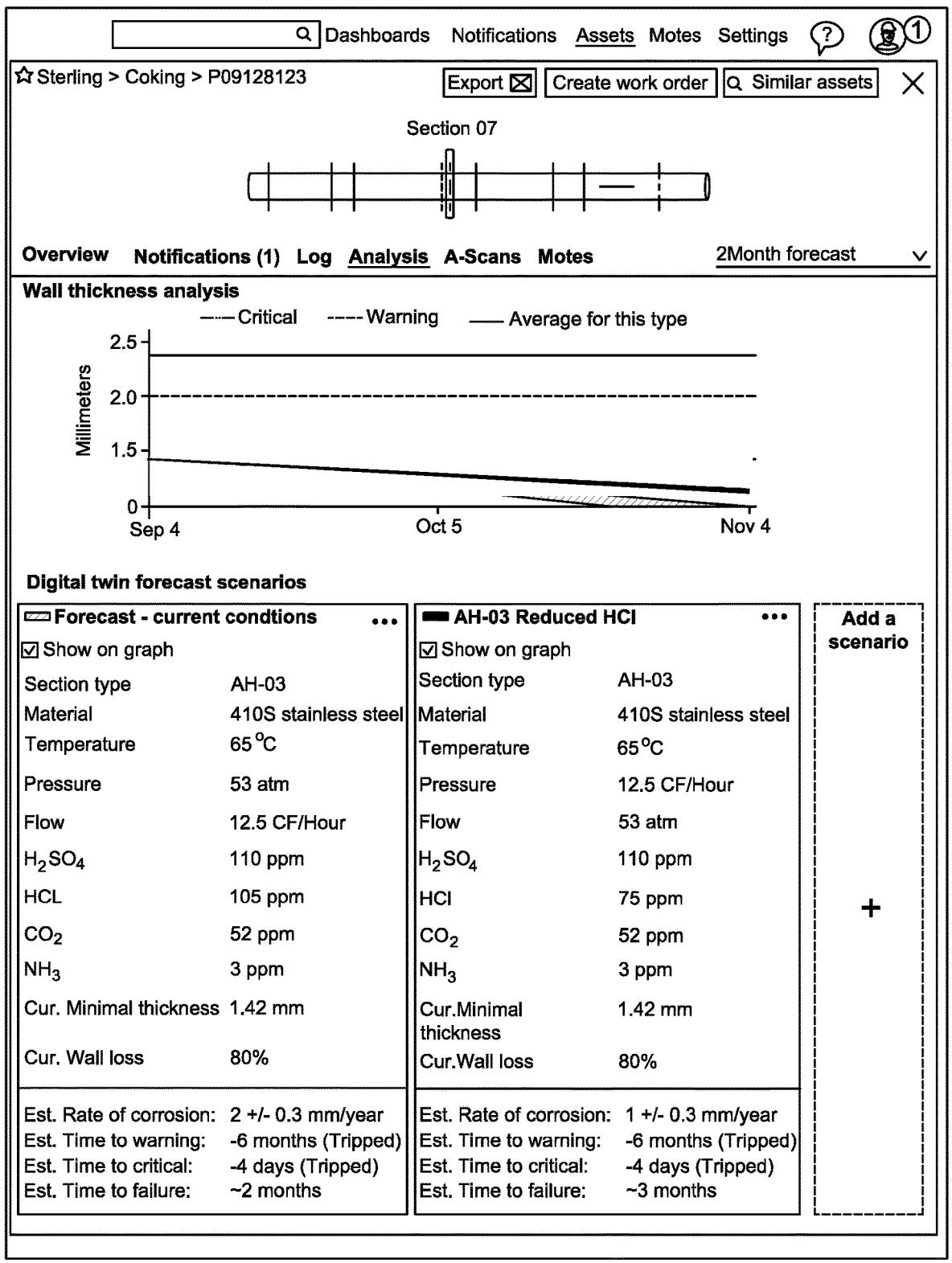

In some implementations, the interface can enable a user to create multiple scenarios (e.g., what-if scenarios) with different conditions. FIGS. 25-29 illustrate an example analysis tab in which different scenarios can be created by the user. FIGS. 25-29 illustrate that each scenario can be created using interactive graphical objects (e.g., slider, text field, and the like) and can be plotted on the data visualization element (e.g., plot of wall thickness). With respect to FIGS. 25-29, on the left are current conditions and, immediately below, the estimates provided by a corrosion forecast model. A user can analyze, for example, how changing the product mix would affect the rate of corrosion and longevity of this illustrated asset. A user can click on "Add a Scenario" section. Some of the recently used scenarios can be displayed (FIG. 26) and have the ability to search different scenarios previously created. "Add New" button can create a new forecast. Inputs to the model can be modified (FIG. 27). In FIG. 27, concentration of HCl is slightly elevated, so, in order to understand what effect that has on corrosion, a user could reduce the concentration of HCl from 105 to 75 ppm. The model predicts that this action extends the life of the asset by about 1 month (FIG. 28). A menu can be used to save this scenario with a new name "AH-03 Reduced HCl". This scenario can be shared with other users in an organization.

Insights gathered from the analysis section can allow a user to make informed decisions, such as deciding whether the user needs a corrosion inhibitor, and if so, to help the user select the right corrosion inhibitor type and amount to protect the assets against the specific product mix.

Figure 30:
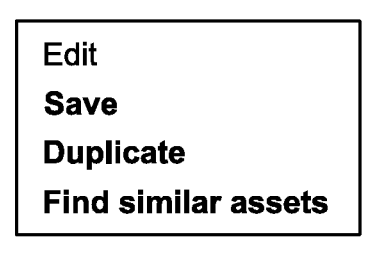

FIG. 30 illustrates an example context menu, which can be used with the analysis tab, and which enables scenarios to be saved and duplicated. The context menu also includes a selection for finding similar assets, which is discussed in more detail below.

Figure 7:
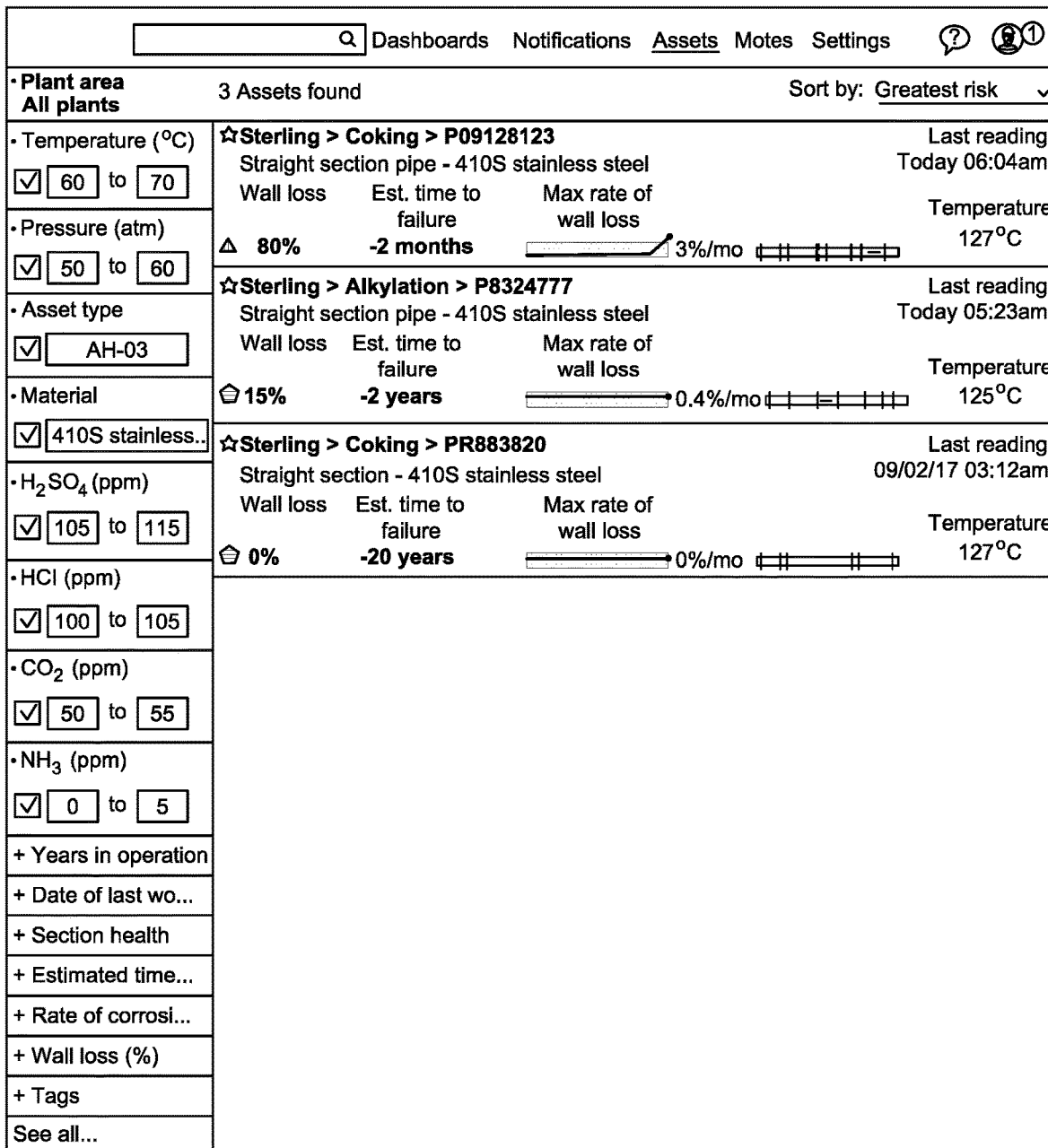
FIG. 7 illustrates search results showing similar assets can be displayed in a similar format as shown in FIG. 3.

In some implementations, a compare assets icon 430 can be included and when selected can cause a search to be performed on all managed assets to identify other assets that are similar and/or related to the current asset (e.g., the asset whose data is visualized). As illustrated in FIG. 7, search results showing similar assets can be displayed in a similar format as shown in FIG. 3. This enables a user to predict similar issues arising in these other assets even before any sign of corrosion can be detected. If the user decides to apply some type of corrosion inhibitor to the pipe they have been investigating, they can evaluate if the same treatment should be applied to these other similar assets that have been identified.

Figure 8:
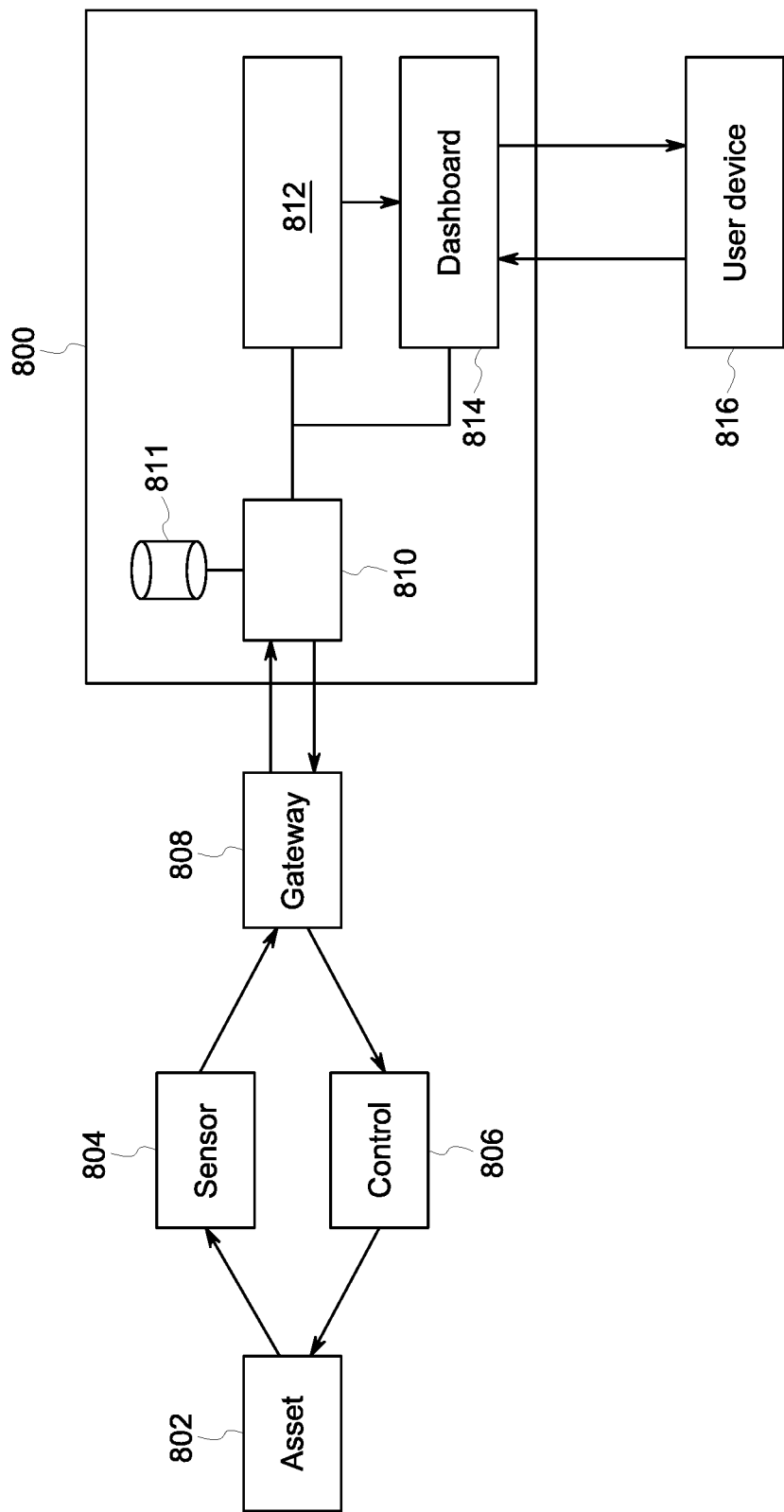
FIG. 8 illustrates an exemplary embodiment of a system block diagram of an asset monitoring system that can communicate with assets.

Using this feature, the user can get deep insights about wear and corrosion before any significant changes can be detected. This allows the user to stay informed and proactively manage assets, maximize revenue, minimize non-productive downtime, improve compliance, and minimize the possibility of a corrosion-related emergency shut-down FIG. 8 illustrates an exemplary embodiment of a system block diagram of an asset monitoring system 800 that can communicate with assets 802. The monitoring system 800 can operationally couple to an asset 802, for example, via a sensor 804 and control system 806 associated with the asset 802. The sensor 804 and control system 806 can communicate with the monitoring system 800 via a gateway 808 (e.g., edge device). The monitoring system 800 can include a digital model system 810, a predictive model engine 812 and a dashboard 814. The predictive model engine 812 can receive the digital model outputs and generate future predictive values using, for example, a predictive model.

Sensors 804 can include any type of sensor that can be incorporated into an industrial asset such as ultrasound sensor, pressure sensor, vibration sensor, temperature sensor, humidity sensor, and the like. As an example, an asset can include sensors measuring wall thickness, temperature, and the like.

Control system 806 can include a controller operably coupled with the asset. The control system 806 can alter the operational parameters of the asset. Where the asset itself can be controlled, for example, if the asset is a pump, the pump can be controlled by changing the frequency of the pump. In some implementations, control system 806 can control operation of the sensors 804. For example, control system 806 can control the frequency that sensor measurements are acquired.

The digital model system 810 can receive sensor data detected by the sensor 804, and transmit control signals to the control system 806. The digital model system 810 can calculate asset characteristics based on the received sensor data and asset data, which can be stored in a memory device 811. The digital system 810 can also communicate with the predictive model engine 812 (e.g., provide sensor measurements and outputs from the digital model) and the dashboard 814 (e.g., provide the dashboard 814 with sensor measurements and outputs from the digital model), and receive from the dashboard 814 with new inputs provided by the user (e.g., utilizing the interactive graphical object 510). The predictive model engine 812 can also communicate with the dashboard 814 (e.g., provide the dashboard 814 with predictions on future values). The dashboard 814 can communicate with a graphical user interface in a user device 816 (e.g., receive inputs from the GUI and provide visualization data to the user device 816).

Figures 9, 10:
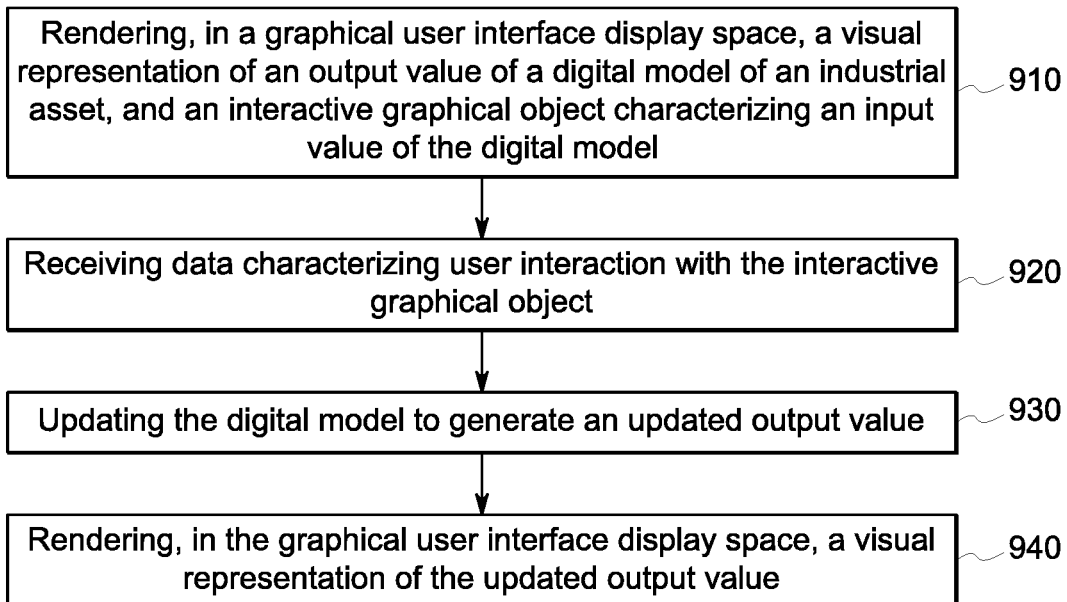
FIG. 9 is a process flow diagram illustrating a process of visualizing data.
FIG. 10 is a process flow diagram illustrating a process of visualizing data

FIG. 9 is a process flow diagram illustrating a process 900 of visualizing data. At 910, a visual representation of an output value of a digital model of an industrial asset and an interactive graphical object characterizing an input value of the digital model is rendered in a graphical user interface display space. For example, an interactive element can be rendered that includes elements for specifying the inputs (e.g., conditions) for predicting future values. The interactive element can include conditions represented by slide bars and/or text fields that a user can interact with.

At 920, data characterizing user interaction with the interactive graphical object is received. The user interaction can include a user interacting with the slide bars and/or text fields to specify a new value of a condition. At 930, the digital model is updated to generate an updated output value. For example, the user inputs can be utilized by a predictive model including a digital model of the asset to predict future values. In some implementations, the digital model can include one or more system coefficients (e.g., predetermined coefficients related to the asset and/or sensors associated with the asset). Updating the digital model can include determining new system coefficients and replacing the coefficients of the digital model with the newly determined coefficients. In some implementations, the new system coefficients can be determined based on data characterizing a property of the asset over a time period (e.g., asset wall thickness data over a period of time) and/or data characterizing user interaction with an interactive graphical object (e.g., interactive graphical object 405, visualization elements 425, interactive element 510, and the like).

At 940, a visual representation of the updated output value is rendered in the graphical user interface display space. For example, the updated output value can be rendered as a line plot showing a predicted value of a property of an asset over time (e.g., into the future). For example, wall thickness can be displayed over time.

FIG. 10 is a process flow diagram illustrating a process 1000 of visualizing data. At 1010, data characterizing a first value of a property of an industrial asset over a first time period is received. The data can originate from a sensor, for example, an ultrasound sensor, which can form part of a linear array of ultrasound sensors located around the circumference of the asset (e.g., pipe). The sensor can return a measurement, which can be indicative of wall thickness at a point associated with the sensor. The property can be, for example, wall thickness.

At 1020, a second value of the property of the industrial asset over a second period of time is determined. The second value can be determined using a predictive model that predicts, based on the past conditions, proposed future conditions, physics models, probabilistic machine learning algorithms, and/or sensor measurements, how the property will change over time. For example, wall thickness can be predicted.

At 1030, the first value of the property and the second value of the property are rendered in a graphical display space. For example, the first value of the property can be rendered in a line plot of wall thickness versus the first time period. The second value of the property can also be rendered in the line plot of wall thickness versus the second time period. In some implementations, the first value of the property characterizes historical sensor measurement values and the second value of the property characterizes predicted future values of the property. In some implementations, the first time period characterizes a time that occurred before a current or present time, e.g., a past time. In some implementations, the second time period characterizes a time that occurred after a current or present time, e.g., a future time.

In some implementations, a thickness of a line illustrating the second property value (e.g., predicted future values) can indicate a probability (e.g., confidence or standard deviation) associated with the second property value (e.g., prediction).

Figure 11:
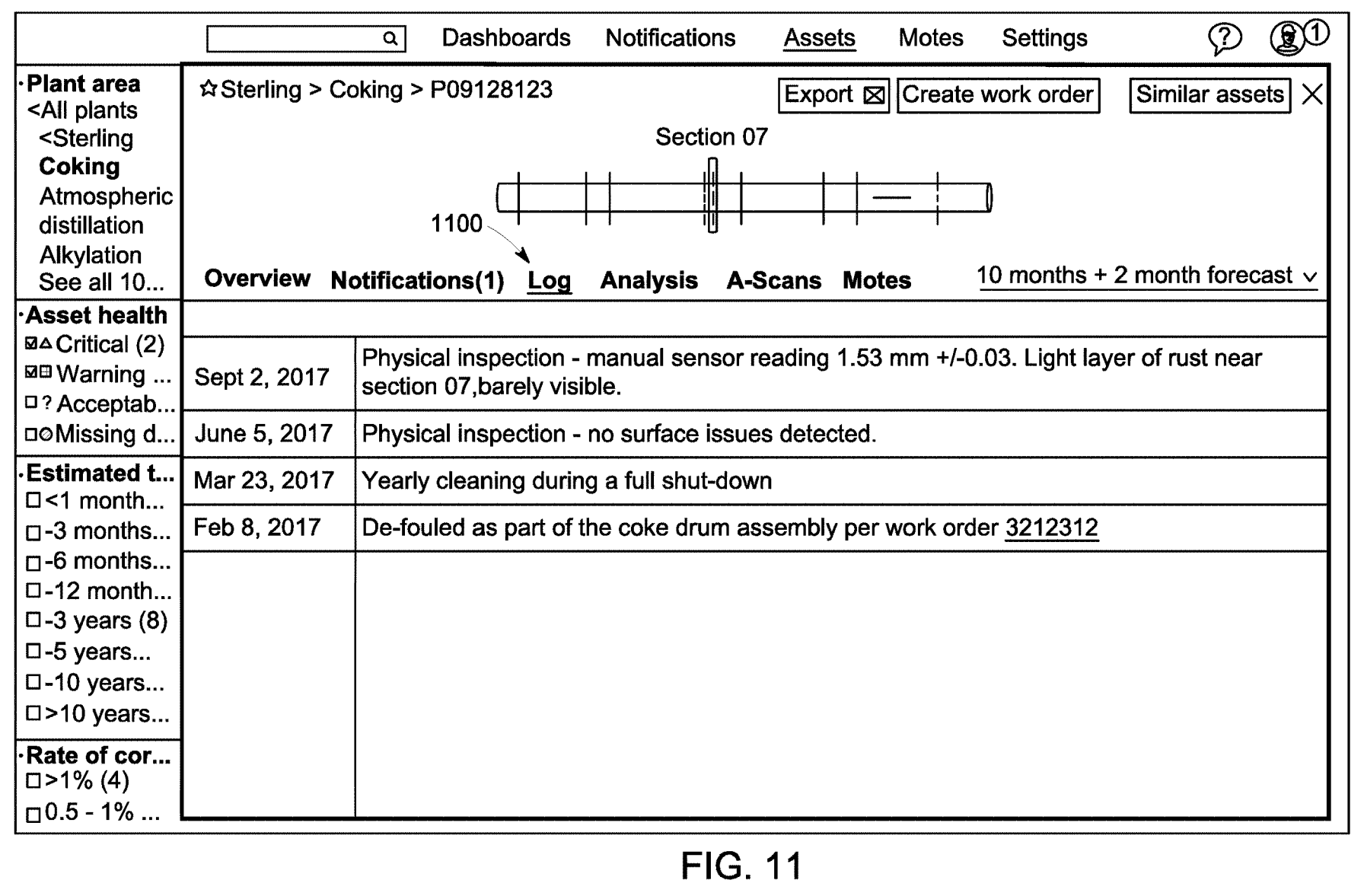

Referring again to FIG. 4, a user can select the log tab in the menu bar 410, which causes the interface to change tabs to the log tab. FIG. 11 illustrates an example log tab 1100. The log tab 1100 can include past events associated with the asset. These log entries can be obtained via an API communicating to other applications which record and store asset maintenance activities.

Figure 12:
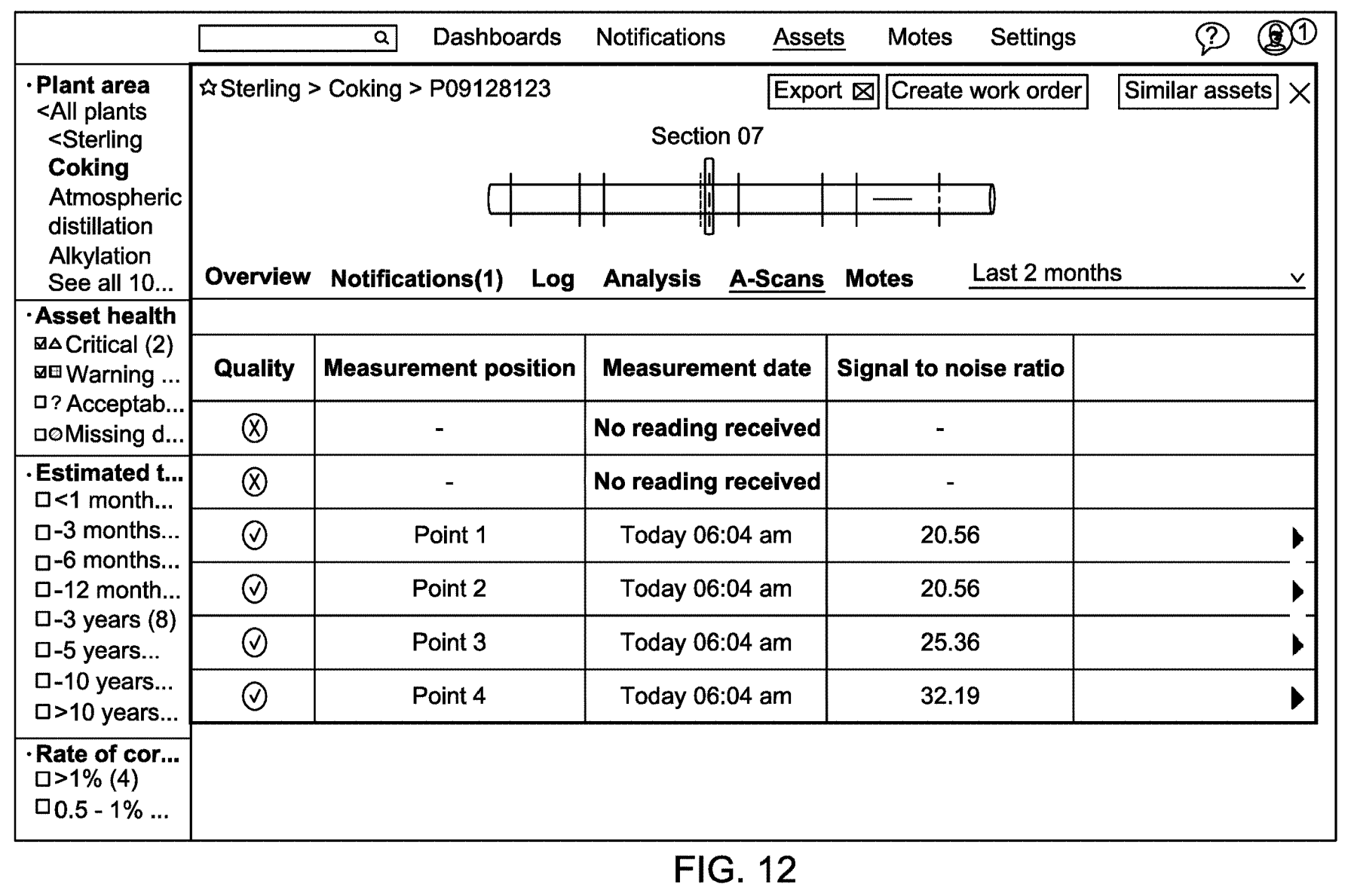
Figure 13:
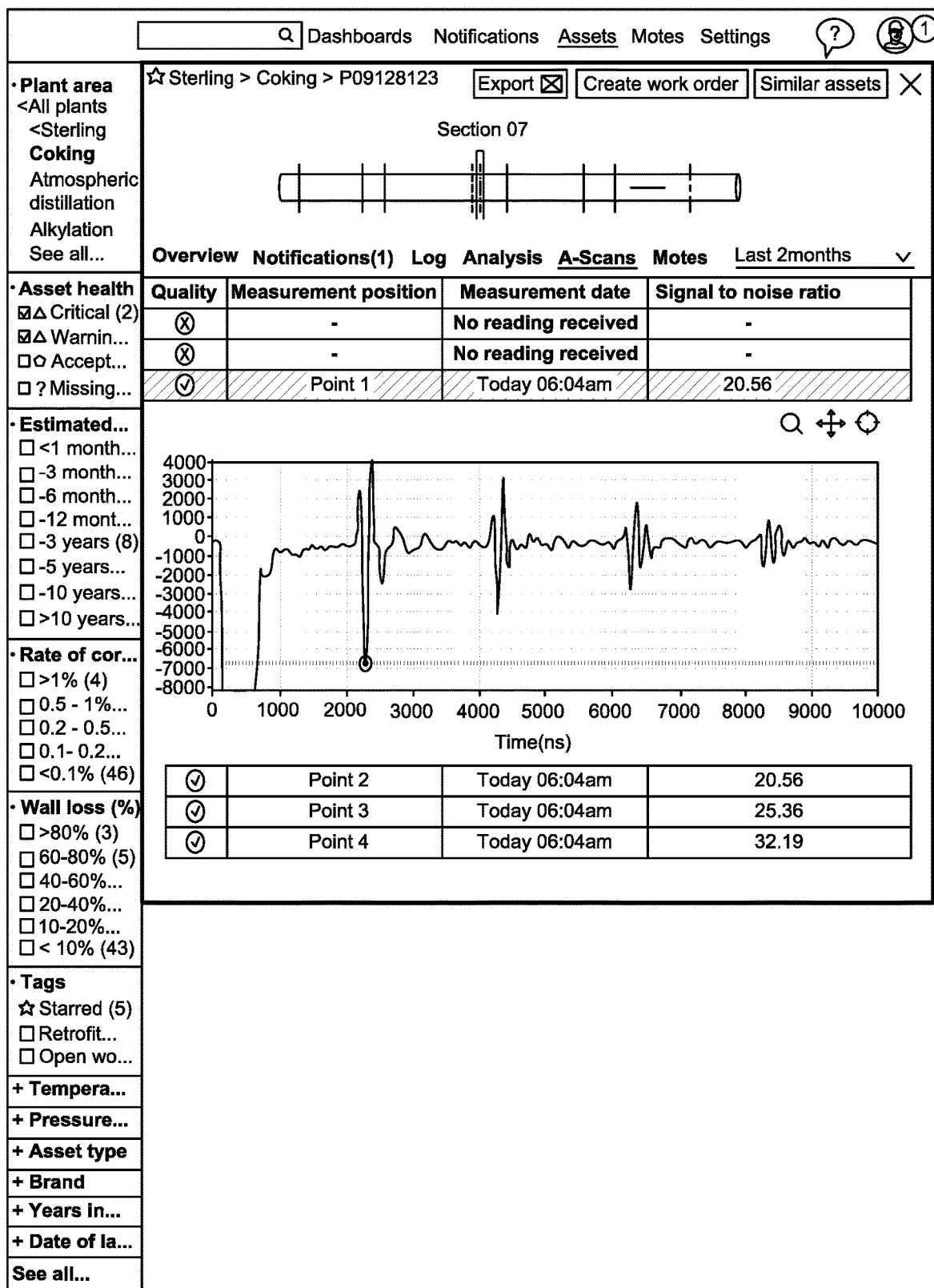
FIG. 13 illustrates the example A-scan tab including the raw sensor data, which, in this example, is ultrasound waveform data.
Figure 14:
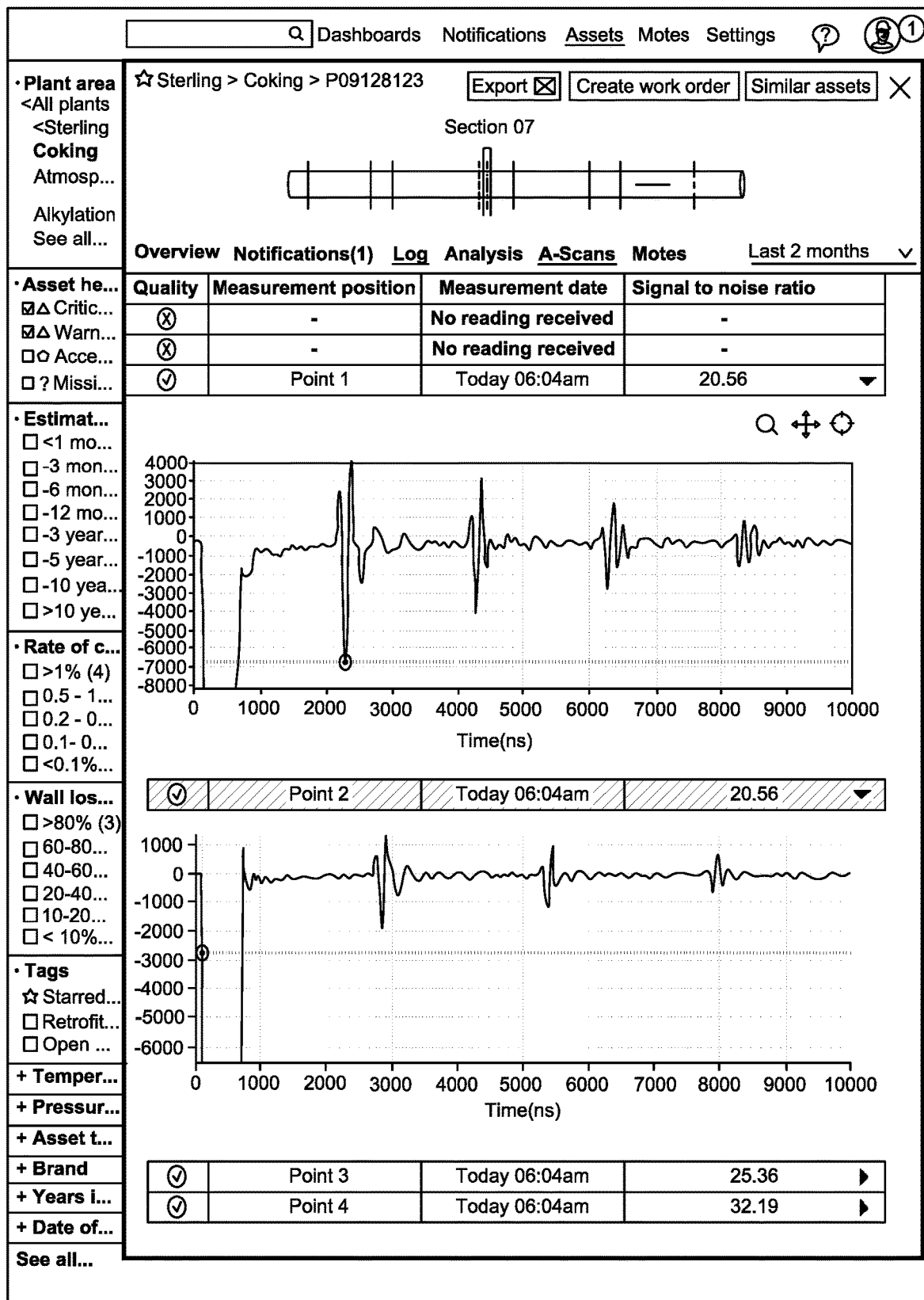
FIG. 14 illustrates that additional entries in the list can be selected by a user and expanded to show the underling raw sensor data.

A user can select the A-scans tab in the menu bar 410, which causes the interface to change tabs to the A-scans tab. FIG. 12 illustrates an example A-scans tab 1200. The A-scans tab 1200 can include a list of sensors in the sensor array (e.g., an entry for each point for which a sensor reading is taken). The user can select a specific entry, which will expand to show the underlying raw sensor data, an example of which is illustrated in FIG. 13. FIG. 13 illustrates the example A-scan tab including the raw sensor data, which, in this example, is ultrasound waveform data. Additional entries in the list can be selected by a user and expanded to show the underling raw sensor data, as illustrated in FIG. 14.

A user can export data to create a corrosion monitoring inspection report. FIG. 15 illustrates an example inspection report according to some implementations. For example, data can be exported to a user computing device (e.g., user device 816) or a computing system configured to monitor the operation of the industrial asset (e.g., monitoring system 800).

Figure 16:
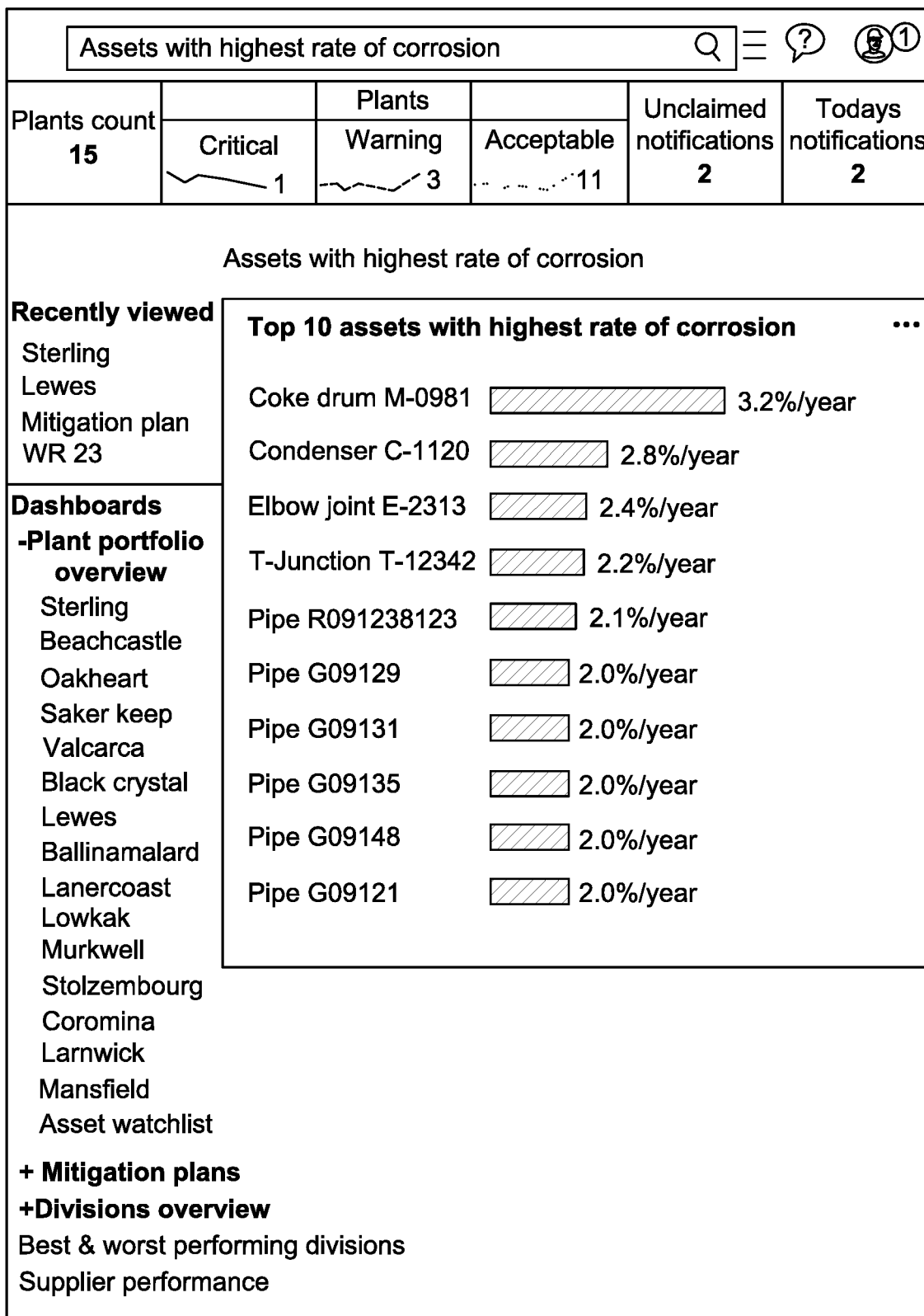
FIG. 16 illustrates the example interface showing the results of a search.

Referring again to FIG. 3, in some implementations, a user can enter text into a field on the menu bar 305 to execute a text search over all assets. Information regarding each asset can be maintained in a database, which can contain the latest sensor measurements. When a user enters text into the search field, a search can be performed of the database. FIG. 16 illustrates the example interface 300 showing the results of a search.

In some implementations, interface 300 can provide a visual overview of all plants that are being monitored and/or managed by the example predictive corrosion management interface. FIG. 17 illustrates an example overview of all monitored plants and a list summarizing plants and ordered according to a measure of risk. The top panel in FIG. 17 can illustrate locations in a network where sensors are installed, for example, corrosion monitoring sensors. Across the top, is a dashboard view, which can show a summary of facilities with points at critical, warning, or acceptable levels. A summary of notifications awaiting attention is shown. On the map view are the locations of the facilities in the network and the status of each site. A list view of locations can be included and how many assets have points at critical or warning levels and how many are healthy can be illustrated. This global level can provide an easy-to-understand summary of facilities in one, simple view.

Figure 18:
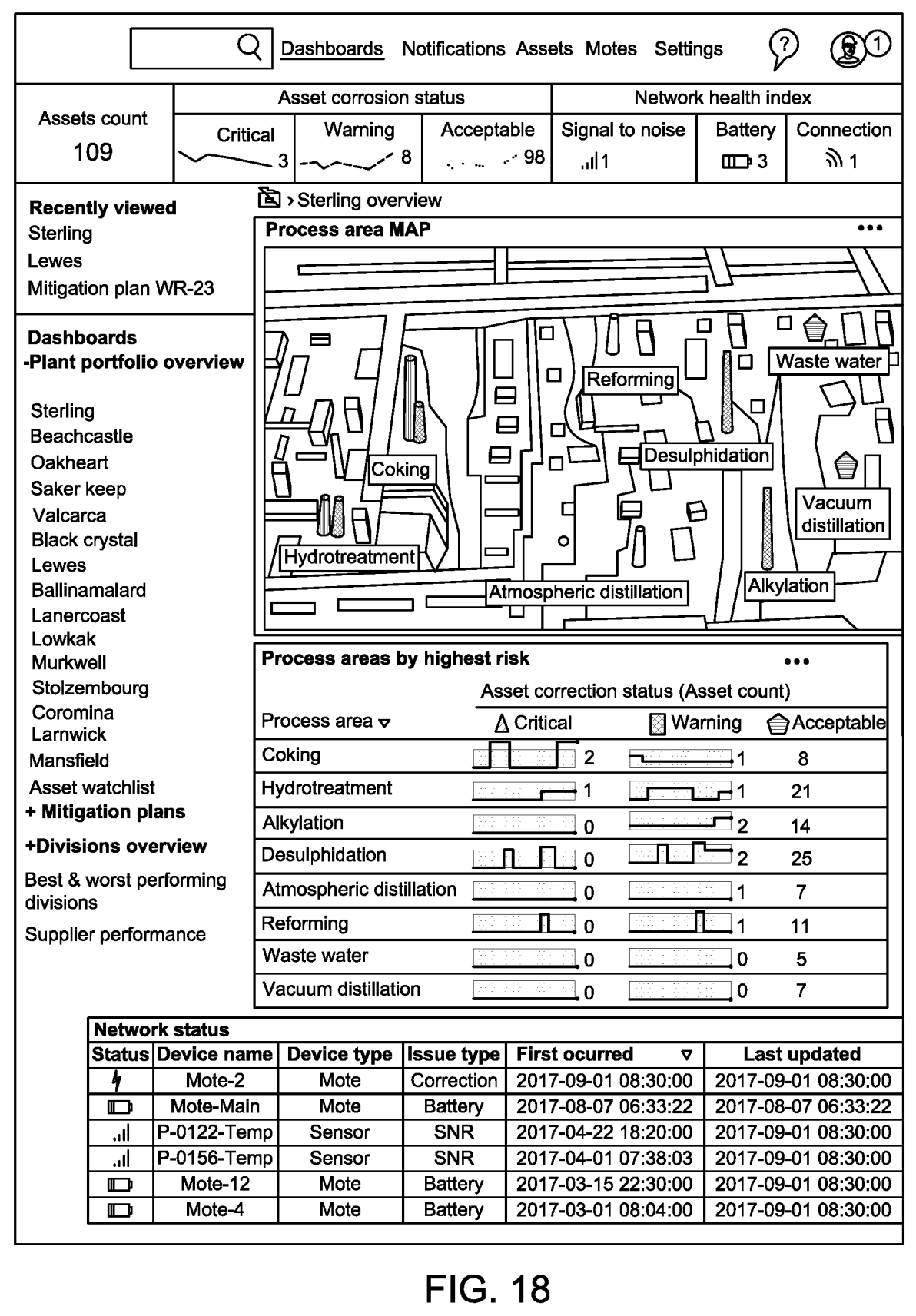

A user can select one of the plants in the list to cause the interface 300 to display an overview of the plant, an example of which is illustrated in FIG. 18. The overview of the plant can include a map illustrating the process area, a list of process areas ordered by highest risk, and network status of devices within the plant. The network status section shows a detailed view of any issues with the installed sensing systems. For example, a problem with a sensor's signal-to-noise ratio, a mote battery issue, a mote connectivity issue, and/or the like.

The subject matter described herein can provide one or more technical advantages. For example, an interface can present a corrosion profile of the asset using a graphical object (e.g., spark line) in search results indicating corrosion sensor placement, alerts, and warnings, as well as rate of corrosion in a word-sized graphic. An interface can present a corrosion profile of the asset in an asset detail form, which can be combined with a cross-section showing placement of the sensors. Thickness trends and prediction at a particular location can also be shown. An interface can present a corrosion profile of the asset using an analysis section for predicting the corrosion rate using a combination of physics and ionic digital twin corrosion models.

In some implementations, a user can precisely correlate how a change in conditions affects the predicted rate of corrosion and thus estimate time to failure of the asset. In some implementations, predicting time to failure of the asset can bes automatically performed.

In some implementations, a corrosion model can combine physics and ionic models, thus allowing for accurate prediction of the rate of corrosion for an asset. This model can allow users to predict how changing the mixture profile (e.g., conditions) will affect the life of the asset even before physical measurements of the rate of corrosion can be obtained. This can enable an early assessment of corrosion, as the rate of corrosion can generally be measured manually and less frequently, such as every 6-12 months, by which time significant corrosion has already occurred. Dynamic interaction with the interface can be achieved allowing the user to get an intuitive feel for the model.

In some implementations, a user can quickly ascertain the profile of the corrosion from search results, without drilling into details. In some implementations, a user can conveniently visualize a complete picture of the corrosion profile of the asset without having to physically examine the asset. In some implementations, the interface enables interaction with a prediction of the way changes in the mixture and conditions (e.g., temperature, pressure, flow) affect the rate of corrosion and life of the asset.

In some implementations, an Asset Integrity Manager can be responsible for ensuring that the equipment in a refinery or other processing facility performs effectively and efficiently throughout the entire asset life cycle. The assets should operate within their safety limits, and be managed to maximize the efficiency and return on those assets. In order to address corrosion, facilities may utilize inspectors across the site inspecting for corrosion and erosion issues on a daily basis, costing millions each year. Some facilities can have over 100,000 thickness monitoring locations, and perform 100% manual point-in-time inspections, whereby 65% require scaffolding to reach, and 90% are under insulation. Installed, configurable sensors allow for continuous monitoring for corrosion. The current subject matter can allow for quick and easy visualization of the status of assets, and can provide analytics for anticipating when issues will arise.

Interface for Forecasting and Root Cause Analysis of Complex Networks and Flows

Some aspects of the current subject matter include an interface including a graphical object for investigating root cause analysis events for network activity, as well as view forecasted future events as predicted by the system.

Figure 22:
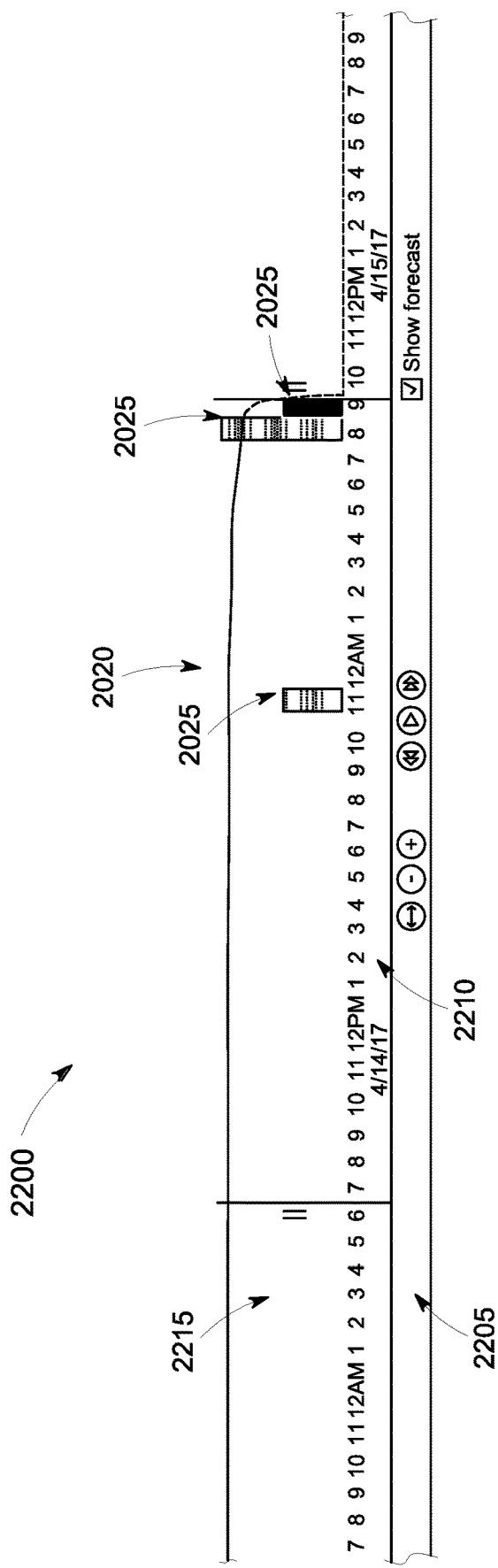
FIG. 22 illustrates an interactive graphical object according to some aspects of the current subject matter.

FIG. 22 illustrates an exemplary interactive graphical object 2200 according to some aspects of the current subject matter. The interactive graphical object 2200 can provide the user an animated view of system forecasting, allowing users to take further advantage of predictive models. The interactive graphical object 2200 can include a menu bar 2205, a time bar 2210, and an event bar 2215.

The menu bar 2205 can include controls and/or icons for controlling the time bar 2210. The controls can include modifying a speed of animation; and expanding or contracting the period currently displayed in the time bar 2210. The time bar 2210 can include a horizontal listing of time indicia, in this case, hours, over the course of several days.

The event bar 2215 can include a region for displaying the events 2225 as vertical bars. The events 2225 can relate to events of an industrial system or process, for example, when a warning state occurs in a fuel plant. In addition, the event bar 2215 can include a line illustrating a parameter value 2220. For example, the parameter value may represent production output value for a fuel plant.

The interactive graphical object 2200 can provide a view for forecasted future events as predicted by a predictive model. The event bar 2215 illustrates past events and parameter values in a first color (e.g., blue), and illustrates future events, as predicted by a predictive model, using a second color (e.g., purple).

Figure 23:
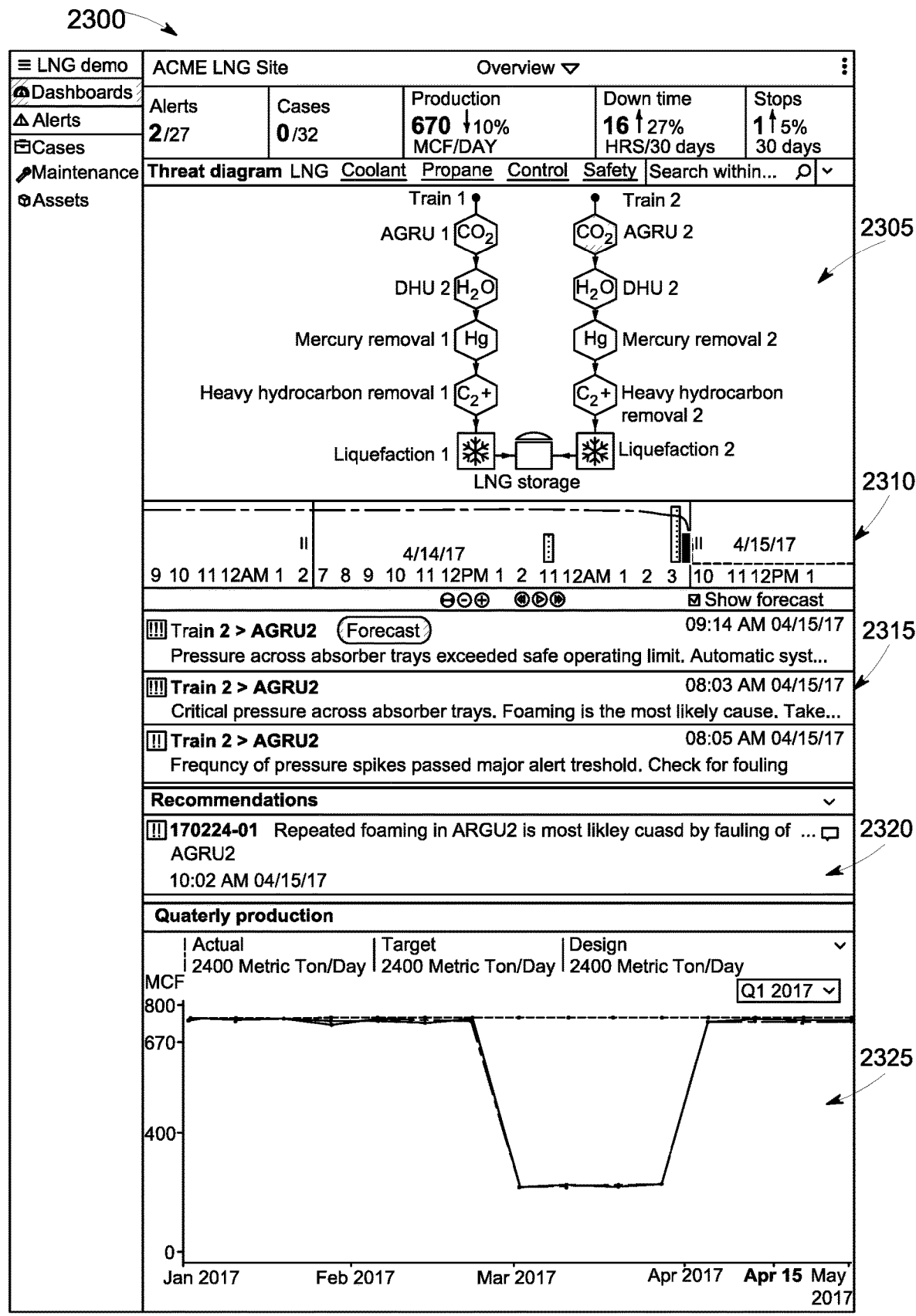
FIG. 23 illustrates an interface for forecasting and root cause analysis of complex networks and flows that includes an example interactive graphical object.

FIG. 23 illustrates an interface 2300 for forecasting and root cause analysis of complex networks and flows that includes an example interactive graphical object. The interface includes a Network/Process Flow diagram 2305, an interactive graphical object including a timeline of events 2310, an events or alerts list 2315 that pertain to the objects shown in the timeline, a recommendation panel 2320, line/bar/dot graph(s) 2325 showing key performance indicators (e.g., critical key performance indicators [KPIs]) with filters and search allowing the users to narrow down the display to the specific objects of interest.

In some implementations, the timeline component can show forecasting, e.g., future events for the system that have not yet taken place. In addition, forecast events can be shown below the timeline, correlated and filtered by the same filters that are combining past states of the network, past events, current state, forecasted future states and forecasted events, all in a single, dynamic display that correlates system activity with KPIs such as production.

Using the interface 2300, the user can investigate root cause analysis events for network activity, as well as view forecasted future events as predicted by the system. This combination of UI components working together can create an animated view combining versatility with utility. The interface 2300 combines information in one place that aids in the user decision making process enabling improved clarity, allowing users to make critical decisions quickly. Having information available allows users to spend less time searching and more time finding and make decisions with greater confidence and clarity.

Figure 24:
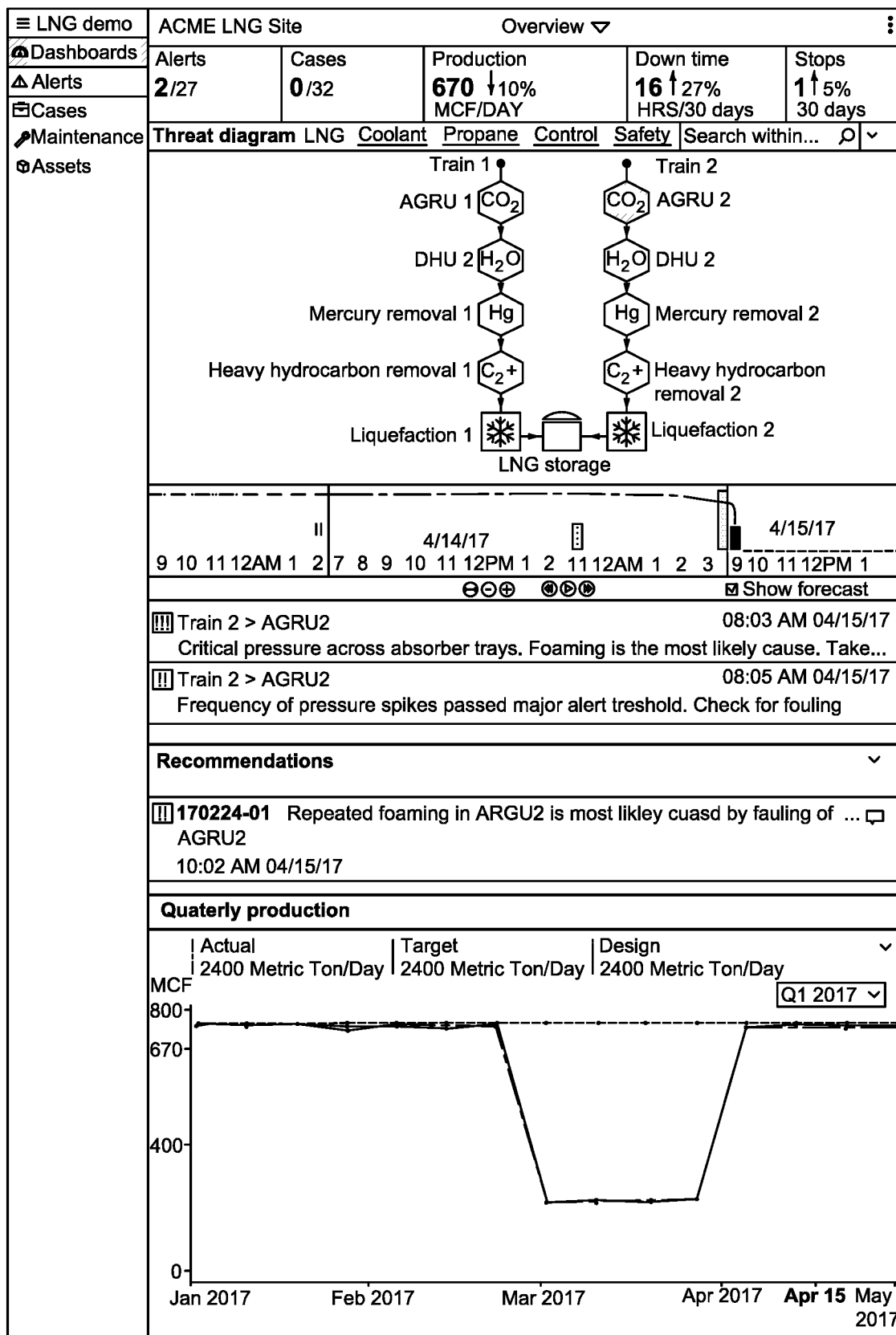
FIG. 24 illustrates another example interface according to some aspects of the current subject matter.
Figure 25:
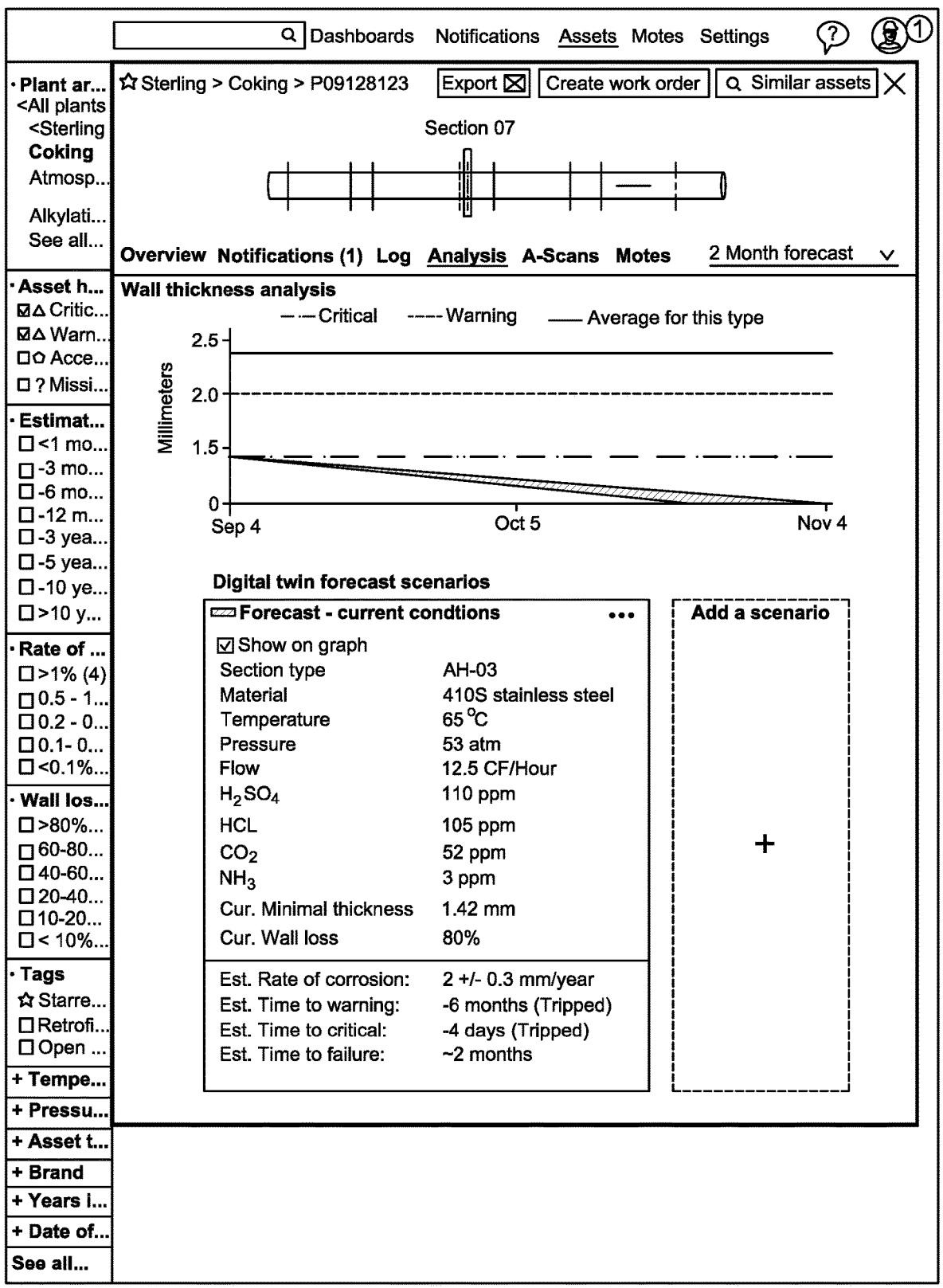
FIGS. 25-29 illustrate an example analysis tab in which different scenarios can be created by the user.
Figure 26:
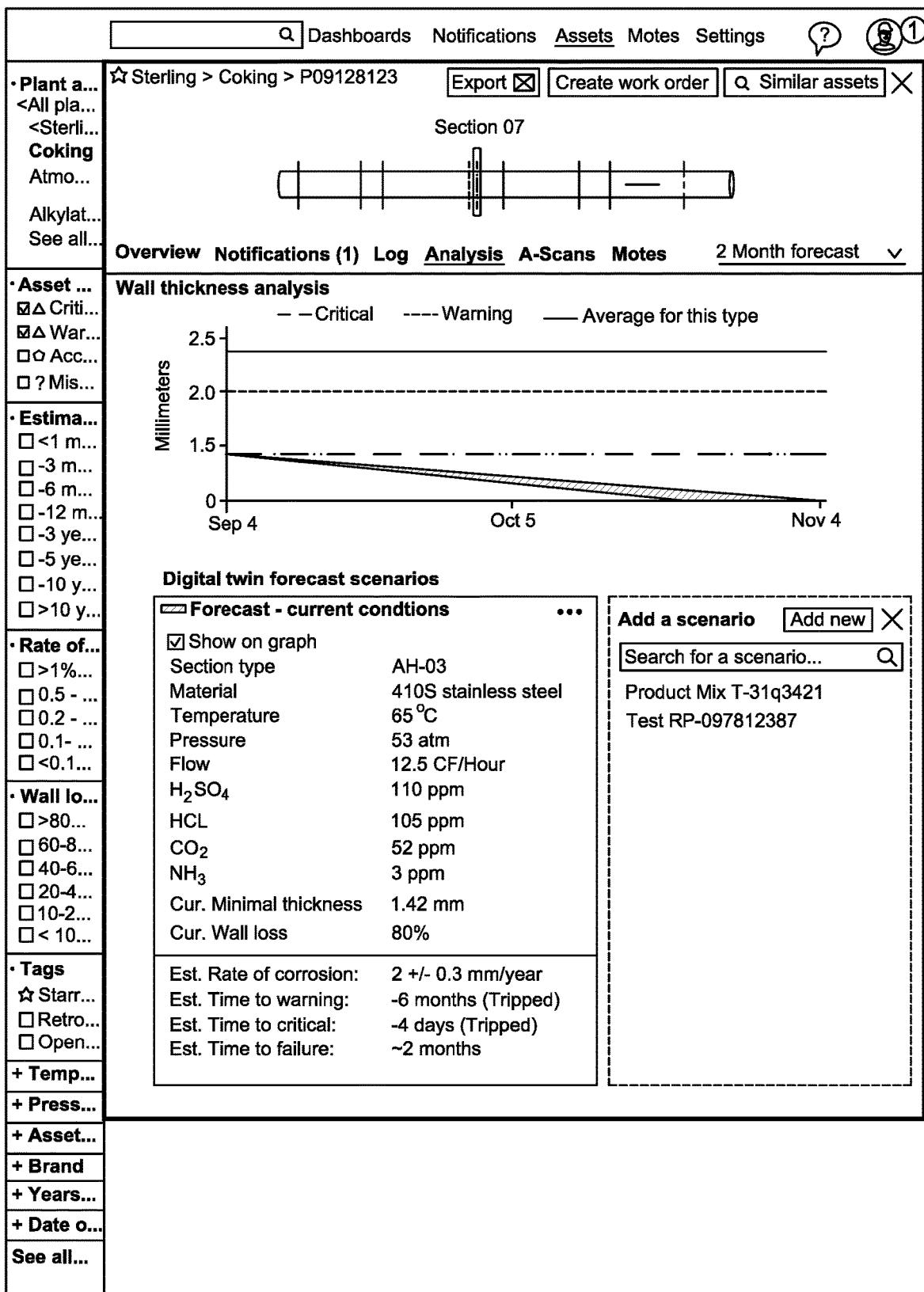

FIG. 24 illustrates another example interface according to some aspects of the current subject matter.

Cloud Based Management and Processing of Sensors

Monitoring of corrosion using installed sensors has a number of advantages. For example, the use of installed sensors allows asset owners to reduce cost of ownership, increase quality of data, and make better decisions to maximize both throughput and safety. In some cases, installed systems, including ultrasound based systems, use on premise hardware, software, and storage to collect and manage data.

Some aspects of the current subject matter can include managing installed sensors remotely through the internet from the cloud, in addition to, storing and later serving data from the cloud. In some implementations, remote management of equipment involved in capturing data from web and mobile device interfaces is also included.

Figure 19:
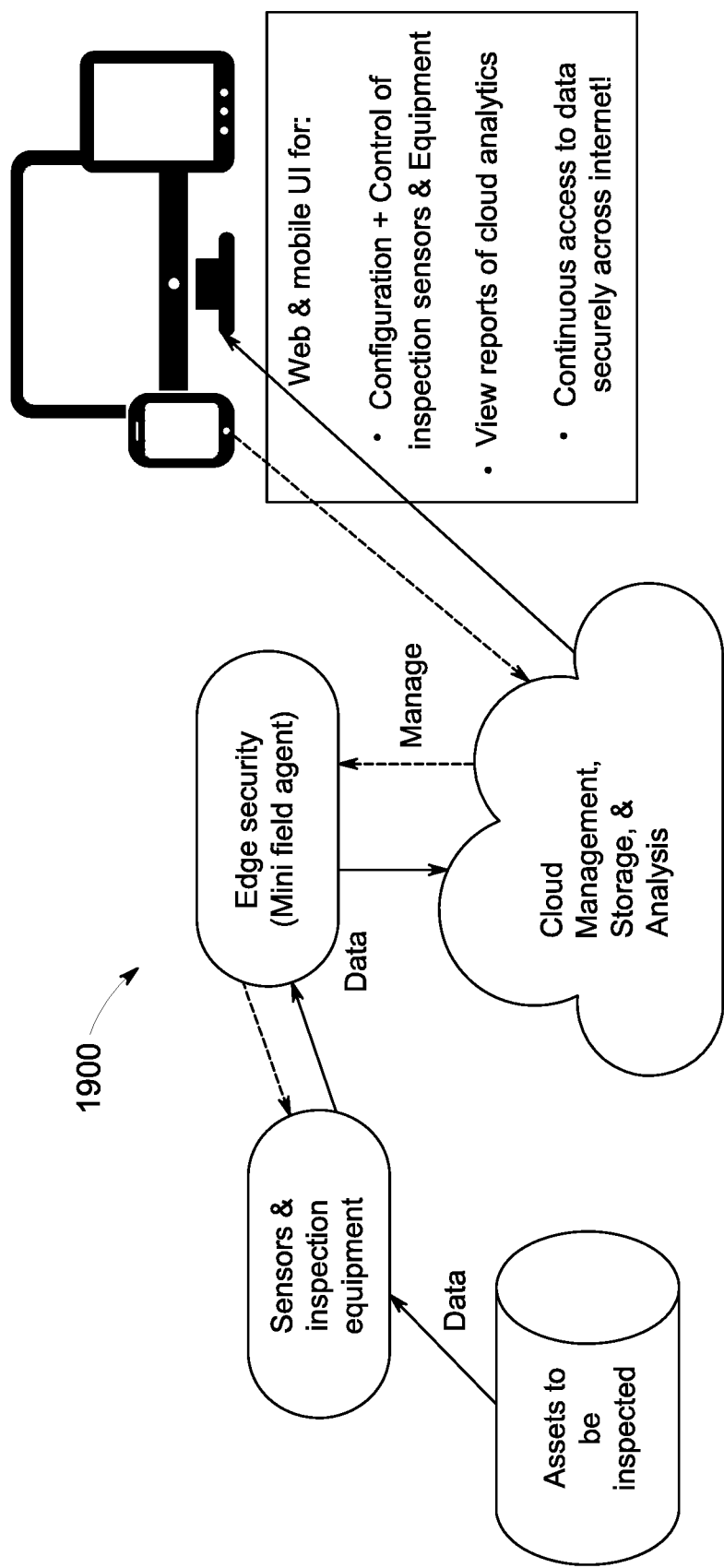
FIG. 19 illustrates a system block diagram illustrating an example hardware management and monitoring system.

Some aspects of the current subject matter can include a system that manages hardware and data using cloud based software. FIG. 19 illustrates an exemplary system block diagram 1900 illustrating an example hardware management and monitoring system. The example system can interface with the cloud using an edge security device. The cloud based software can control and/or manage the hardware settings (e.g., versus using local hardware to do the same). The software can also manage the asset maps that associate sensor positions with the location on the physical asset and also can locate the system geospatially. A user can read or write the hardware settings using the cloud based software. In addition, the software manages the frequency of the sensor measurements, triggering which measurement occurs in which order.

In some implementations, when a sensor measurement is triggered, the raw ultrasound data, along with supporting information can be transmitted to the cloud for processing and storage. The data can be stored in a way that associates it with an asset and a specific location. Once in the cloud, the data can be visualized by the user, for example, as described above. The data can also be processed further if necessary. If the user wants to change the processing algorithms, these new algorithms can be applied to all or a subset of historical data sets or just applied to newly generated data.

In some implementations, if the hardware settings used to collect the data needs to be modified, these changes can be pushed into the hardware via the cloud, making it easy to manage the hardware without being collocated with the system.

In some implementations, the example system can collect ultrasound data (e.g., voltage amplitude as function of time), can process the data using mathematical filters and transformations, and/or can use algorithms to determine time spacing between specific features. The time difference can be used with a temperature corrected velocity to calculate thickness of assets. By monitoring thickness as a function of time, corrosion rates can be calculated. By combining these corrosion rates with additional data streams, such as pH, flow rates, vibration, chemical concentrations, and the like, additional insight into asset life management can be gained. Further processing of the ultrasound data enables extraction of other transient features of assets being monitored, such as the emergence of defects, the fluctuation in spaces or voids and collection of plaques and/or sediments within those assets. Performing hardware control, data management and processing in the cloud can provide users with a more robust and configurable system that can be adapted over time to suit user's original and emerging needs.

Figure 20:
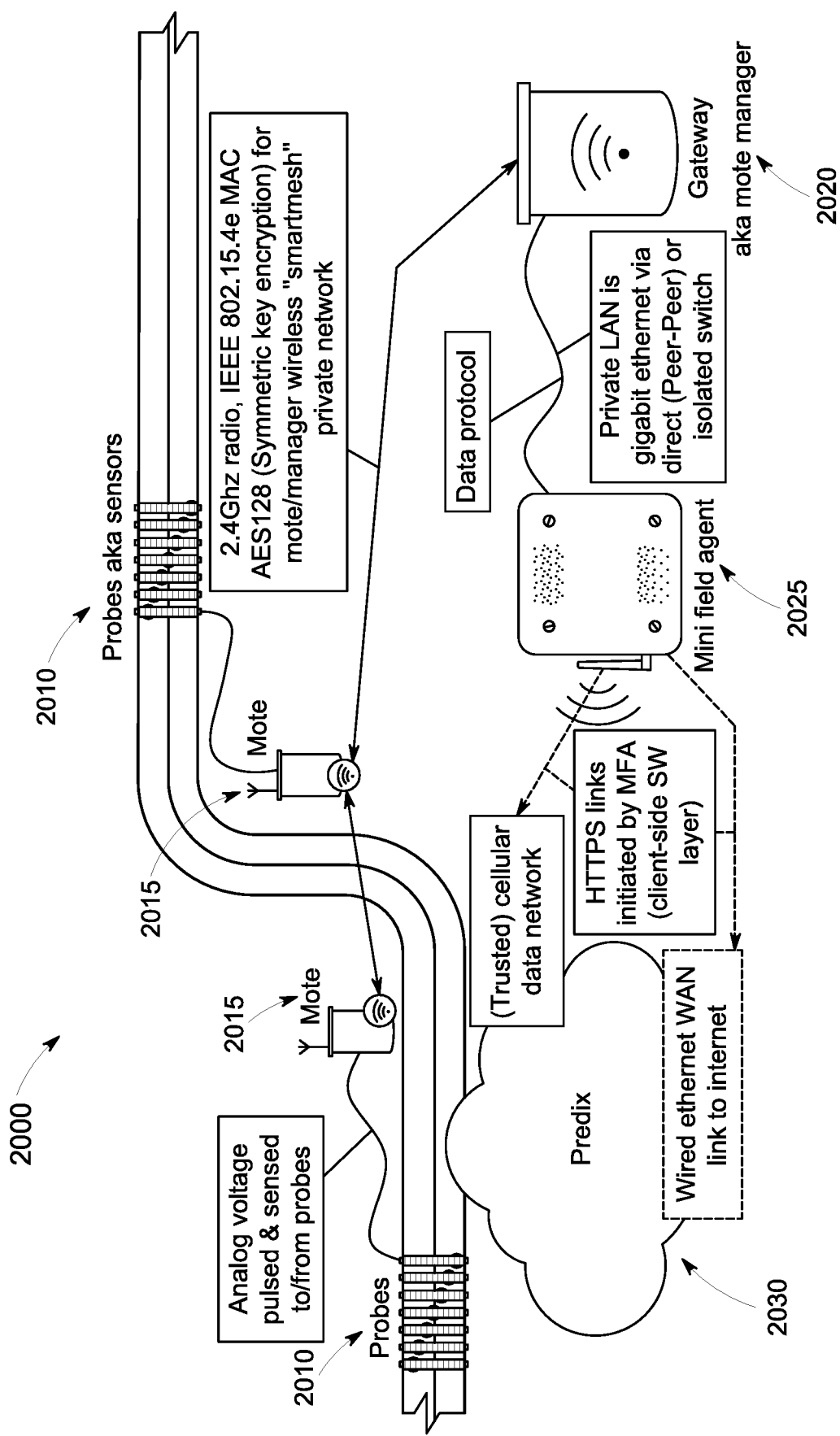
FIG. 20 illustrates an example system including a sensor network for transporting data between assets and the cloud according to some aspects of the current subject matter.

FIG. 20 illustrates an example system 2000 including a sensor network for transporting data between assets and the cloud according to some aspects of the current subject matter. The system 2000 includes an asset 2005 (in this example, a pipe), sensors arrays 2010, motes 2015 (also referred to as a node), gateway 2020, edge device 2025 (also referred to as a mini field agent), and cloud 2030.

Each sensor array 2010 can include a number of ultrasound sensors positioned around the asset at different points to measure the thickness of the asset 2005 wall at that point. The sensors 2010 are connected (via wires) to motes 2015, which serve as nodes in the sensor network that are capable of performing some processing, gathering sensory information, and communicating with other connected motes in the network. Each mote 2015 can be connected to multiple sensors 2010 and can receive sensor measurements (e.g., analog voltage pulsed and sensed by sensors). The motes 2015 can connect wirelessly (e.g., via a wireless protocol) to the gateway 2020, which, in turn is connected to the edge device 2025. In some implementations, gateway 2020 and the edge device 2025 are connected over a private local area network and communication is encoded for security. The edge device 2025 can connect, for example, to the cloud over a wired or wireless data network.

Consider an example in which a user has four sites (e.g., plants), two gateways per site, six motes per gateway, and sixteen sensors per mote (motes are supporting multiple components in the assets). An example measurement sequence can include installation of hardware in the field and initial set up by field service. During installation, the edge security device, also known as a field agent, can be given a unique cryptographic identity using SSL and can be registered with the cloud software by system administrators to verify authenticity of the edge device, the cloud software, and the customer site. Additionally, both customer users and customer internet endpoints can be identified to ensure that access to data and equipment are restricted to authorized users and locations. Assets can be associated with measurement points, equipment settings values can be established, the frequency of measurements can be specified, and the like. The system can be started and measurement schedule can be set in cloud and then requested by the field agent/edge security device at predetermined intervals. Security enforced by the field agent can mutually authenticate with the cloud using transactions that can originate from itself (e.g., the field agent prohibits incoming traffic it didn't ask for to virtually eliminate probing and intrusion threats from the internet). The scheduled time can be reached for a measurement for one of the motes associated with the gateway connected to the field agent. The field agent can send the command to the gateway (addressed to the targeted mote). Gateway can forward that command via wireless mesh network (directly or through other motes) until it reaches the targeted mote. Mote can run the measurement sequence on the sensors connected, can collect associated temperature measurements, can package up the data and send it back to gateway via the mesh network. Gateway can direct data back to field agent. The field agent can encrypt and transmit data to the cloud using https (Hyper Text Transfer Protocol Secure). Received data can be mapped back to customer assets and locations based on prior configuration (step 2 above) and stored for that specific user upon successful authentication. Received data can be analyzed based on information and settings retrieved from user specific cloud storage. Original data plus various derived data (e.g., thickness, signal to noise ratio, temperatures, alerts at time of calculation, equipment health) can be stored for visualization by user and to immediately notify user if predetermined alert thresholds are crossed In some implementations, a user can change (e.g., increase or decrease) frequency of readings on an asset that contains two motes, the following is an example process: User from any internet connected computer can log in to cloud. User can enter equipment settings menu. User can use menu structure to drill down to motes, which can need changed frequency. User can change the frequency of measurements (e.g., from every 24 hours to 12 hours). The field agent can request updates from the cloud at a following predetermined interval and can detect the schedule change. The field agent can adjust scheduling of the equipment accordingly, and thereafter these two motes can send measurements on the newly specified interval (e.g., 12 hour intervals).

In some implementations, a user can update hardware instrument settings during the lifetime of product, the following is an example process: consider where two sensors are having issues measuring thickness because corrosion has blurred the second back wall, requiring user to change from cross correlation to first peak measurements. User from any internet connected computer logs in to the cloud. User enters equipment settings menu and identifies measurement points that need to have their analysis method adjusted and changes the settings. Next measurement in the schedule that arrives in the cloud is analyzed using new method. Settings of the method such as time offset are set based on measurements taken early in the assets life, so user does not need to manual set/reset. User has option to recalculate historical data using new method if there is value or need.

Some aspects of the current subject matter can provide many technical advantages. For example, some systems may require on premises hardware, software, and storage to collect and manage data. In some implementations, the current subject matter can implement efficient protocols to transfer data into the cloud where software and storage can primarily reside. The current subject matter can provide real time efficient and continuous management and collection of data that is served by the cloud and made securely accessible across the internet. The current subject matter can lower cost of ownership. Management and updating of equipment may be done by experts not on premises. Continuous data to asset owners can also mitigate environment risks. The current subject matter can include combined data services to enable advanced analytics including machine learning.

Oil/gas production can include a complex combination of several sub-processes that can be related to various units of the oil production system. For example, the oil production system can include crude distillation unit, control valves, pumps, reservoir, casing, pumps, tubing and the like. Liquefied Natural Gas ("LNG") production system can include wells, slug catcher unit, condensate column unit, condensate tank unit, CO2 separator unit, and the like. The overall oil/gas production can be improved by improving one or more of its sub-processes. A sub-process can be improved by providing a user with what-if scenarios for the sub-process in an automated manner. In the what-if scenario, operating parameters (e.g., state parameters, user configurable parameters, and the like) of the sub-process can be tweaked to identify the parameter values that can improve the overall efficiency of production.

Figure 21:
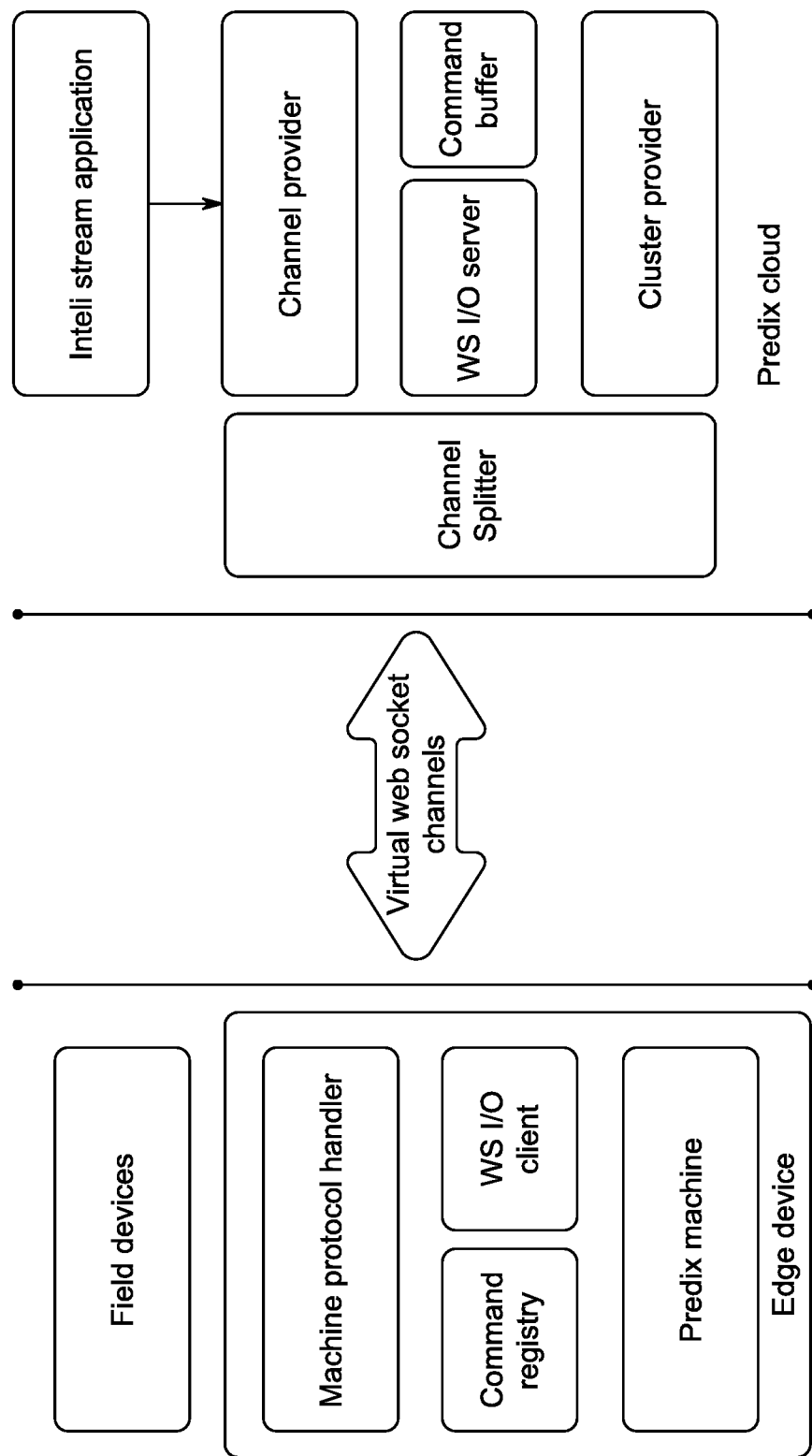

FIG. 21 illustrates an exemplary bi-directional connectivity between an edge device and a cloud platform including a digital model engine, dashboard, and the like. The bidirectional connectivity enables an edge device to avoid opening a listening port on the edge device thereby allowing the bi-directional communication to maintain a high level of security. The edge device can include, for example, a computing system associated with an asset. The edge device can allow the asset to receive a signal (e.g., control signal for changing operational parameters of the asset, signal requesting asset information, and the like).

Bi-directional communication between various intelligent assets operational technologies (OT), and between operational technologies and asset information technology (IT) can allow for collection of information, collaboration and centralized asset management, and the ability to monitor asset state and health from the cloud. In addition, the bidirectional communication can allow for monitoring of the edge device status in the cloud and can allow for remote control of operational parameters (e.g., control parameters for pumps, valves, and the like).

The bi-direction communication can be based on the combination of software components that utilize the messaging systems and web socket protocol. Cloud side of the bi-directional communication can utilize cloud platform technology stack. An application in the cloud can utilize the 'Channel Provider' APIs to send the required command to the edge device, which can implement virtual I/O channels between the edge device and the cloud using web sockets application protocol (e.g., standard outbound ports 80 and 443). Secure socket layer (SSL) for encryption and edge manager for device registry can ensure end-to-end security. The bi-directional connectivity enables an edge device to avoid opening a listening port on the edge device thereby allowing the bi-directional communication to maintain a high level of security. Edge device can utilize a cloud platform machine framework, which get the commands from the cloud and executes them, to provide the result of the command. Every sub-system in the solution can be highly scalable.

Edge devices can use mobile networks (e.g., partner mobile cellular network) to connect to cloud platform. A private access point name (e.g., IP Address) can be provided to the edge device to communicate over the cellular network. Data can traverse over Mobile Private Network (MPN) up to the carrier data center. Data can be transferred from the carrier data center to cloud platform over internet protocol security (IPSec) virtual private network (VPN). Once the edge device registers with an edge manger in the cloud platform, a web socket connection can be established between the edge device and edge manager running in the cloud. The web socket connection can be kept active by sending a signal at regular interval (e.g., less then 1 KB keep alive packet at every 5 minute interval). In some implementations, no opening of a listening port on the edge device is needed. A client application running in the cloud can send commands to the edge device manager's command buffers. A web socket I/O server running in the edge device manager can retrieve the commands from the command buffer and push them to the edge device over the web socket connection. The machine protocol handler service running in the cloud platform machine at the edge can interpret the command and translates the TCP/IP command to a serial protocol (such as Modbus) values to be sent to the field device. In some implementations, edge devices can connect to cloud platform using wired networks and/or satellite broadband.

Other embodiments are within the scope and spirit of the disclosed subject matter. For example, some aspects of the current subject matter have been described with reference to oil and gas production, the current subject matter can be applied to a broad range of industrial fields, such as chemical processing, food processing, nuclear power, transmission pipe lines, storage facilities, and the like.

Figure 31:
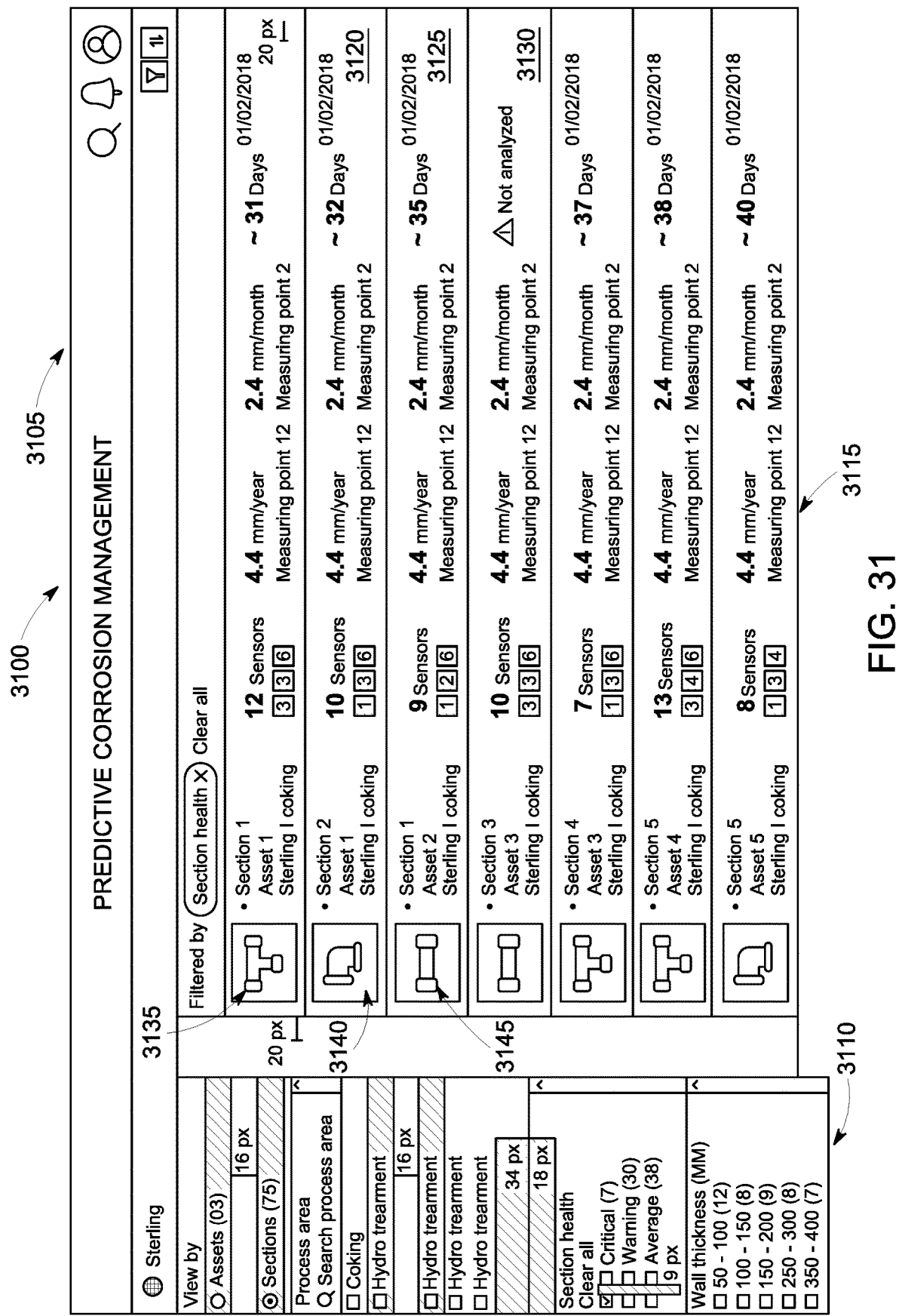
FIG. 31 illustrates an exemplary interface that allows for corrosion management of assets.

FIG. 31 illustrates an exemplary interface 3100 that allows for corrosion management of assets. Interface 3100 can include a menu bar 3105, a vertical taskbar 3110, and a data panel 3115. The menu bar 3105 can include search tabs for accessing different modules within the interface 3100. The vertical taskbar 3110 can allow for searching through available assets based on process area, section health, wall thickness and the like. The data panel 3115 can show results of the faceted search listing assets and brief summaries of data related to the asset. In the example of FIG. 31, there are multiple list entries (e.g., 3120, 3125, 3130, etc.). Each list entry can include the name of the asset, a brief description of the asset, sensors associated with the asset, alarm levels associated with the sensors, measurement location, predicted corrosion rate percent wall loss, a graphical object representing the assets (e.g., 3135, 3140, and 3145, respectively), and the like. By including these graphical objects in search result lists, the current subject matter can allow a user to quickly ascertain the status of an asset, such as the profile of corrosion within a pipe, without having to review detailed sensor data. This can provide a clear and intuitive representation of complex sensor data.

Figure 32:
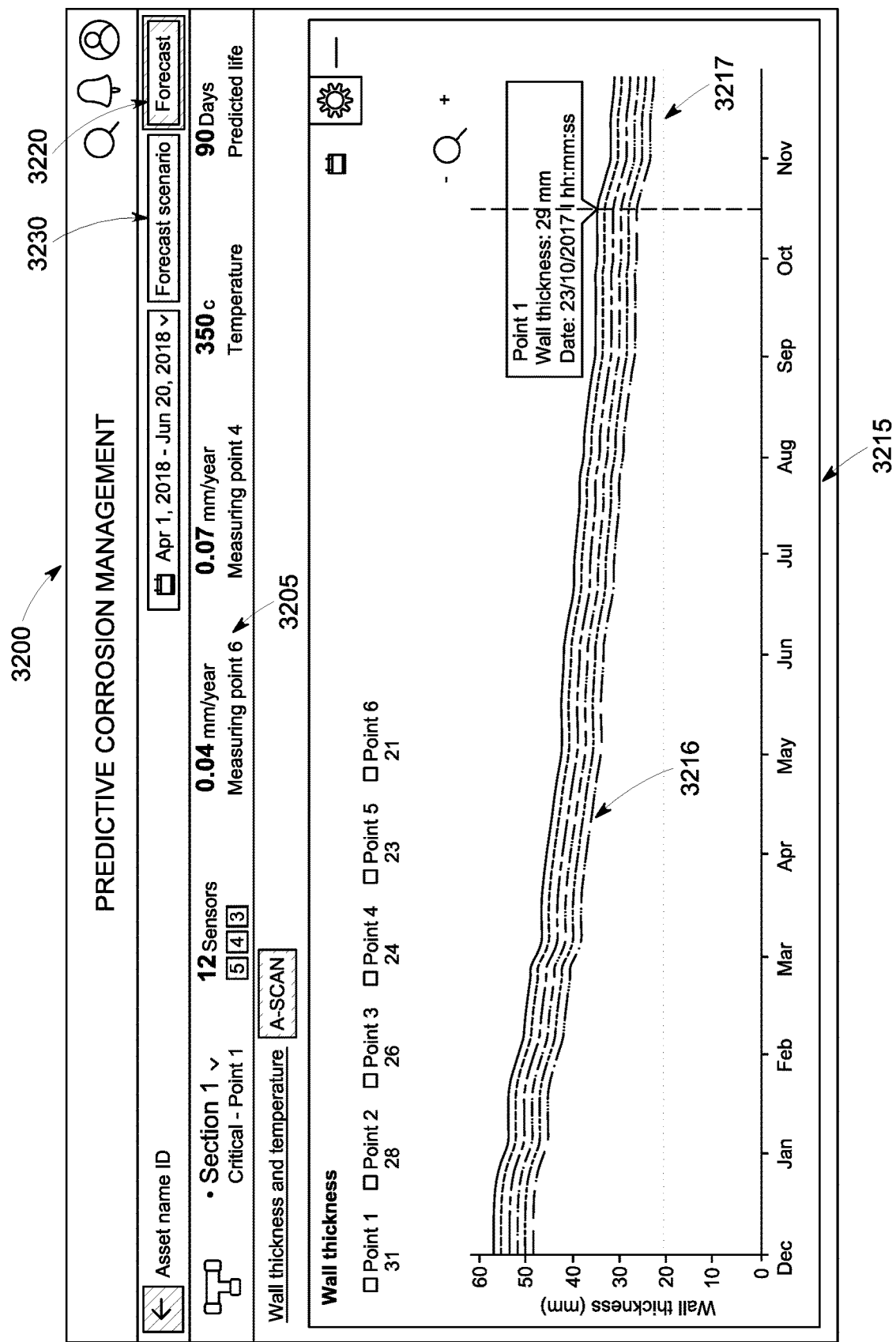
FIG. 32 illustrates an exemplary interface having a window showing details of a selected asset.
Figure 33:
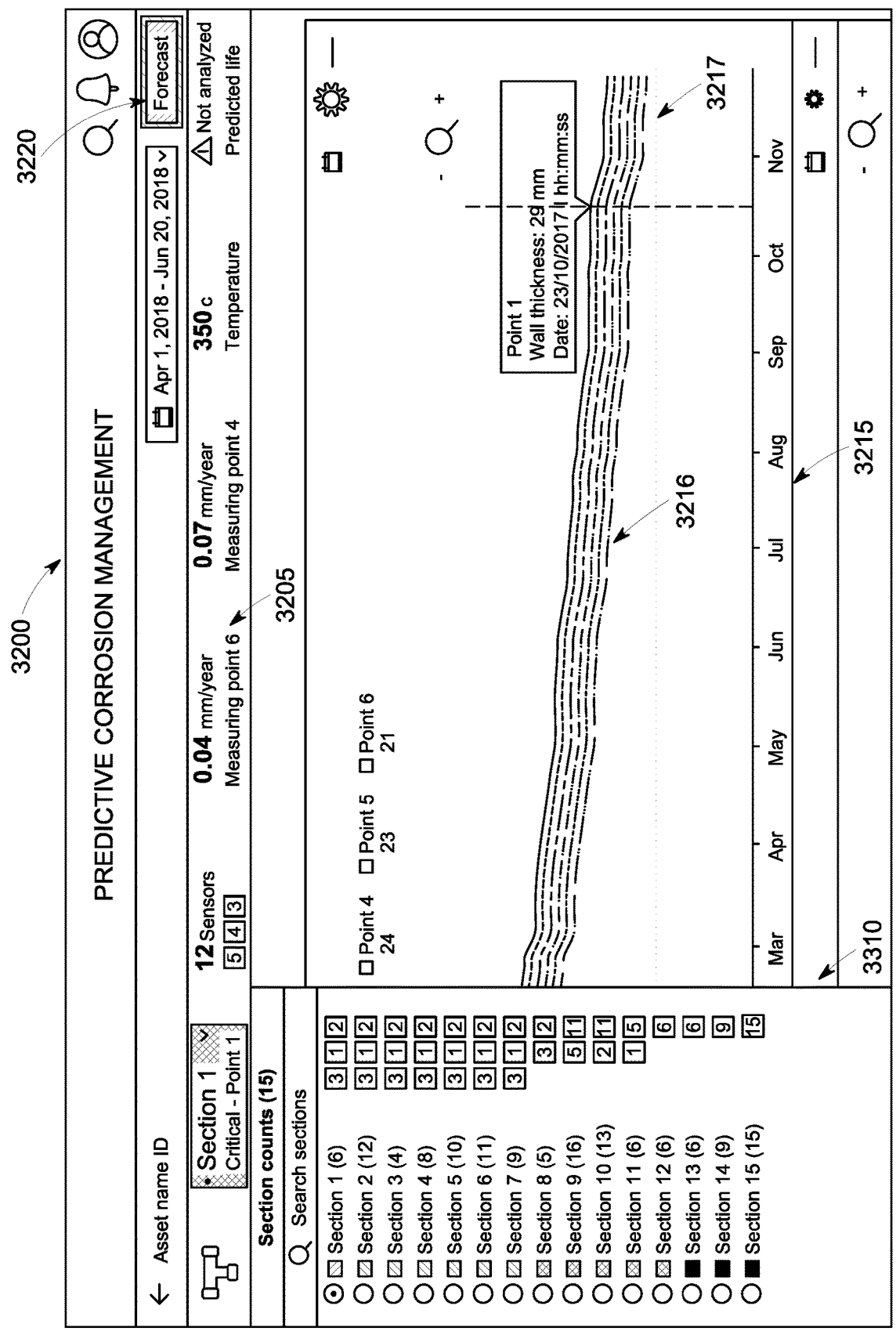
FIG. 33 illustrates the interface of FIG. 32 having a vertical section taskbar.

FIG. 32 illustrates an interface 3200 with a window showing details of a selected asset (e.g., asset 3120, 3125, 3130, etc.). The interface can include a horizontal tool bar 3205 that can include the name of the asset, a brief description of the asset, percent wall loss, estimated time to failure, maximum rate of wall loss, time of last wall-thickness sensor reading, temperature, and a graphical object representing the asset (e.g., 3135, 3140, 3145, respectively). The interface 3200 can include a visualization element 3215 that can include a plot 3216 of detected data at multiple detection locations on the asset (e.g., by sensors associated with the asset) and a plot 3217 of predicted data associated with the multiple detection locations on the asset. In some implementations, the plot 3217 of predicted data can be generated by clicking on the forecast tab 3220. In some implementations, the interface 3200 can include a forecast scenario tab 3230 that can enable a user to create multiple scenarios (e.g., what-if scenarios) with different conditions. FIG. 33 illustrates the interface 3200 that includes a vertical section taskbar 3310. The vertical section taskbar 3310 can include information related to the various section of the asset (e.g., number of sensors associated with the sections, alarm types, etc.).

Figure 34:
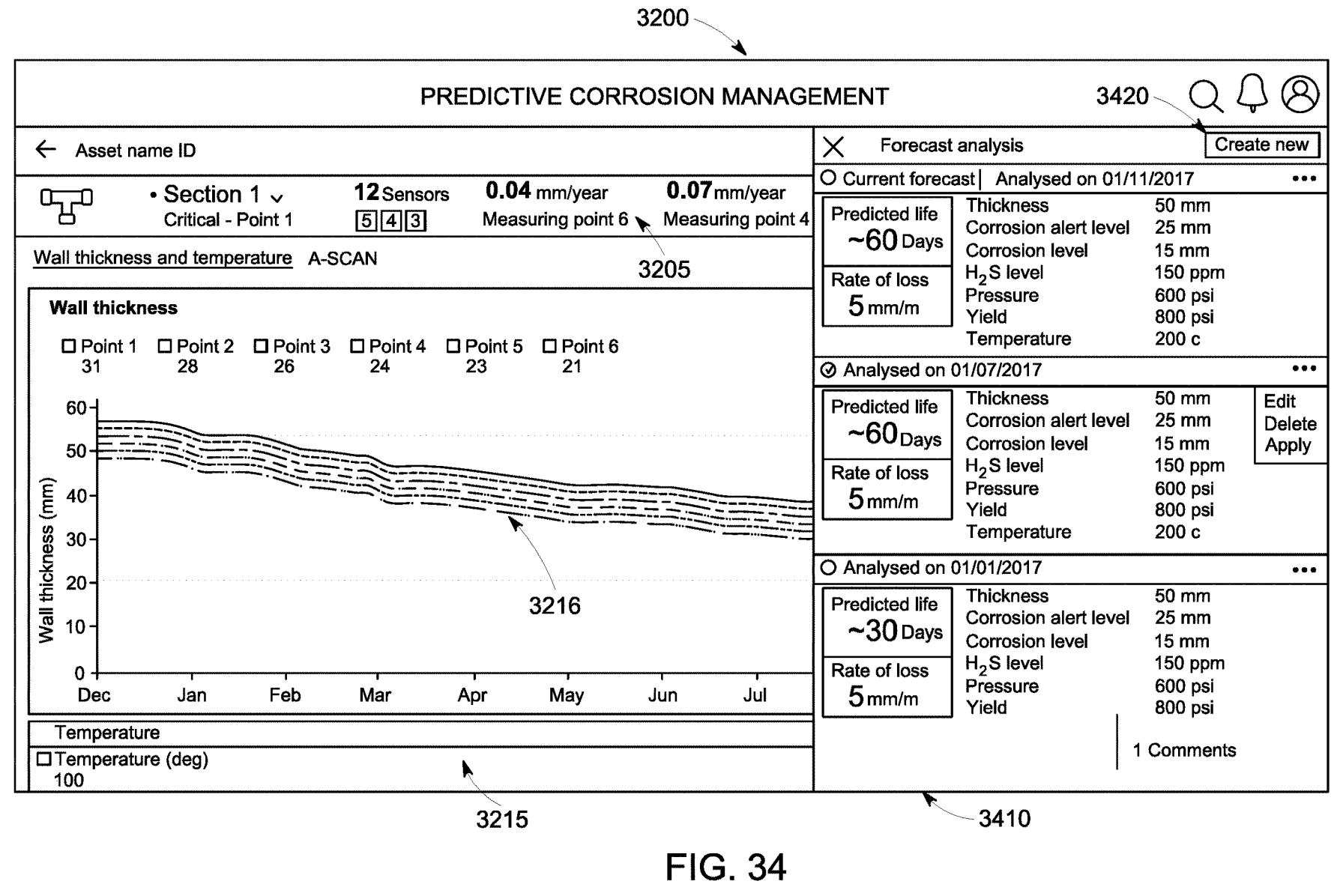

FIG. 34 illustrates the exemplary interface 3200 that includes the vertical forecast taskbar 3410. The vertical forecast taskbar 3410 can be generated, for example, by clicking on the forecast scenario tab 3230. The taskbar 3410 can include the current forecast (e.g., predicted life, rate of loss of thickness, etc.), data of the forecast, and the like. The taskbar 3410 can also include previous forecasts and data associated with the previous forecast. The taskbar 3410 can also include a create new tab 3420 that can allow the user to create a new scenario for forecast (e.g., what-if scenarios).

Figure 35:
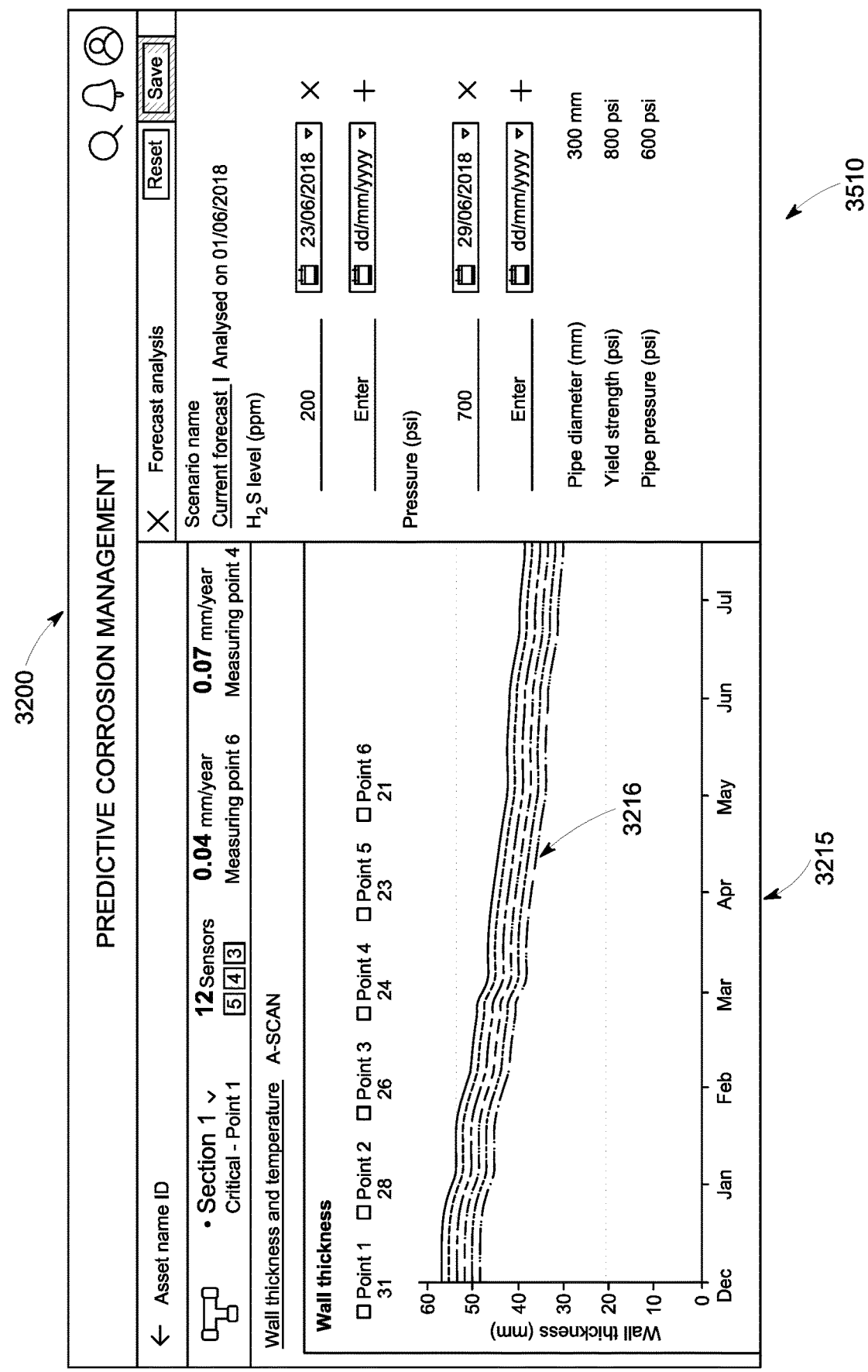
FIG. 35 illustrates the interface of FIG. 32 having a forecast analysis taskbar.

FIG. 35 illustrates the interface 3200 that includes a forecast analysis taskbar 3510. The forecast analysis taskbar 3510 can be obtained, for example, by clicking on the create new tab 3420. The taskbar 3510 can allow for creation of a new forecast scenario. For example, the user can enter information related to the asset (e.g., pressure, H2S level, etc.). Based on the entered information, forecast analysis (e.g., prediction of the change in wall thickness of the asset) can be performed.

Certain exemplary embodiments are described to provide an overall understanding of the principles of the structure, function, manufacture, and use of the systems, devices, and methods disclosed herein. One or more examples of these embodiments are illustrated in the accompanying drawings. Those skilled in the art will understand that the systems, devices, and methods specifically described herein and illustrated in the accompanying drawings are non-limiting exemplary embodiments and that the scope of the present invention is defined solely by the claims. The features illustrated or described in connection with one exemplary embodiment may be combined with the features of other embodiments. Such modifications and variations are intended to be included within the scope of the present invention. Further, in the present disclosure, like-named components of the embodiments generally have similar features, and thus within a particular embodiment each feature of each like-named component is not necessarily fully elaborated upon The subject matter described herein can be implemented in digital electronic circuitry, or in computer software, firmware, or hardware, including the structural means disclosed in this specification and structural equivalents thereof, or in combinations of them. The subject matter described herein can be implemented as one or more computer program products, such as one or more computer programs tangibly embodied in an information carrier (e.g., in a machine-readable storage device), or embodied in a propagated signal, for execution by, or to control the operation of, data processing apparatus (e.g., a programmable processor, a computer, or multiple computers). A computer program (also known as a program, software, software application, or code) can be written in any form of programming language, including compiled or interpreted languages, and it can be deployed in any form, including as a stand-alone program or as a module, component, subroutine, or other unit suitable for use in a computing environment. A computer program does not necessarily correspond to a file. A program can be stored in a portion of a file that holds other programs or data, in a single file dedicated to the program in question, or in multiple coordinated files (e.g., files that store one or more modules, sub-programs, or portions of code). A computer program can be deployed to be executed on one computer or on multiple computers at one site or distributed across multiple sites and interconnected by a communication network.

The processes and logic flows described in this specification, including the method steps of the subject matter described herein, can be performed by one or more programmable processors executing one or more computer programs to perform functions of the subject matter described herein by operating on input data and generating output. The processes and logic flows can also be performed by, and apparatus of the subject matter described herein can be implemented as, special purpose logic circuitry, e.g., an FPGA (field programmable gate array) or an ASIC (application-specific integrated circuit).

Processors suitable for the execution of a computer program include, by way of example, both general and special purpose microprocessors, and any one or more processor of any kind of digital computer. Generally, a processor will receive instructions and data from a read-only memory or a random access memory or both. The essential elements of a computer are a processor for executing instructions and one or more memory devices for storing instructions and data. Generally, a computer will also include, or be operatively coupled to receive data from or transfer data to, or both, one or more mass storage devices for storing data, e.g., magnetic, magneto-optical disks, or optical disks. Information carriers suitable for embodying computer program instructions and data include all forms of non-volatile memory, including by way of example semiconductor memory devices, (e.g., EPROM, EEPROM, and flash memory devices); magnetic disks, (e.g., internal hard disks or removable disks); magneto-optical disks; and optical disks (e.g., CD and DVD disks). The processor and the memory can be supplemented by, or incorporated in, special purpose logic circuitry.

To provide for interaction with a user, the subject matter described herein can be implemented on a computer having a display device, e.g., a CRT (cathode ray tube) or LCD (liquid crystal display) monitor, for displaying information to the user and a keyboard and a pointing device, (e.g., a mouse or a trackball), by which the user can provide input to the computer. Other kinds of devices, such as handheld tablets and smartphones, can be used to provide for interaction with a user as well. For example, feedback provided to the user can be any form of sensory feedback, (e.g., visual feedback, auditory feedback, or tactile feedback), and input from the user can be received in any form, including acoustic, speech, or tactile input.

The techniques described herein can be implemented using one or more modules. As used herein, the term "module" refers to computing software, firmware, hardware, and/or various combinations thereof. At a minimum, however, modules are not to be interpreted as software that is not implemented on hardware, firmware, or recorded on a non-transitory processor readable recordable storage medium (i.e., modules are not software per se). Indeed "module" is to be interpreted to always include at least some physical, non-transitory hardware such as a part of a processor or computer. Two different modules can share the same physical hardware (e.g., two different modules can use the same processor and network interface). The modules described herein can be combined, integrated, separated, and/or duplicated to support various applications. Also, a function described herein as being performed at a particular module can be performed at one or more other modules and/or by one or more other devices instead of or in addition to the function performed at the particular module. Further, the modules can be implemented across multiple devices and/or other components local or remote to one another. Additionally, the modules can be moved from one device and added to another device, and/or can be included in both devices.

The subject matter described herein can be implemented in a computing system that includes a back-end component (e.g., a data server), a middleware component (e.g., an application server), or a front-end component (e.g., a client computer having a graphical user interface or a web interface through which a user can interact with an implementation of the subject matter described herein), or any combination of such back-end, middleware, and front-end components. The components of the system can be interconnected by any form or medium of digital data communication, e.g., a communication network. Examples of communication networks include a local area network ("LAN") and a wide area network ("WAN"), e.g., the Internet.

Approximating language, as used herein throughout the specification and claims, may be applied to modify any quantitative representation that could permissibly vary without resulting in a change in the basic function to which it is related. Accordingly, a value modified by a term or terms, such as "about" and "substantially," are not to be limited to the precise value specified. In at least some instances, the approximating language may correspond to the precision of an instrument for measuring the value. Here and throughout the specification and claims, range limitations may be combined and/or interchanged, such ranges are identified and include all the sub-ranges contained therein unless context or language indicates otherwise.

What is claimed is:

1. A method comprising:
   receiving data identifying an industrial asset;
   receiving data characterizing one or more sensors configured to detect a first property of the asset;
   determining a first graphical representation of the asset based on the received data identifying the industrial asset, and a second graphical representation of a first sensor of the one or more sensors based on the received data characterizing one or more properties of one or more sensors;
   rendering, in a graphical display space, the first graphical representation and the second graphical representation, wherein one or more visual properties of the second graphical representation are indicative of one or more properties of at least one of the first sensor and the detected first property of the asset,
      wherein a position of the second graphical representation in the graphical display space relative to the first graphical representation is indicative of a first location of the first sensor on the asset,
      receiving a first user input indicative of a selection of the first sensor;
      determining a third graphical representation of a cross-section of the asset at the first location, the third graphical representation indicative of one or more sensor element locations of one or more sensor elements of the first sensor on the cross-section of the asset; and
      rendering the third graphical representation in the graphical display space.

2. The method of claim 1, further comprising:
   receiving a second user input indicative of a selection of a first sensor element of the one or more sensor elements;
   determining a first plot indicative of the first property of the asset and detected by the first sensor element at a first sensor element location of the one or more sensor element locations; and
   rendering the first plot in the graphical display space.

3. The method of claim 2, further comprising:
   receiving a third user input indicative of a selection of a second sensor element of the one or more sensor elements;
   determining a second plot indicative of the first property of the asset and detected by the second sensor element at a second sensor element location of the one or more sensor element locations; and
   rendering the second plot in the graphical display space, wherein the second plot is superimposed on the first plot.

4. The method of claim 1, further comprising:
   receiving a second user input indicative of selection of a second sensor of the one or more sensors, the second sensor located at a second location on the asset;
   determining a fourth graphical representation of a second cross-section of the asset at the second location, the fourth graphical representation indicative of one or more sensor element locations of one or more sensor elements of the second sensor on the second cross-section of the asset; and
   rendering the fourth graphical representation in the graphical display space.

5. The method of claim 1, wherein the one or more visual properties of the second graphical representation comprises a color of the second graphical representation indicative of the first property of the industrial asset detected by the first sensor.

6. The method of claim 1, wherein the one or more visual properties of the second graphical representation comprises an opacity of the second graphical representation indicative of a corrosion rate associated with the industrial asset detected at the first location detected by the first sensor.

7. The method of claim 1, wherein the first property comprises a wall thickness of the asset.

8. The method of claim 1, wherein
   a dashboard is configured to receive data identifying the industrial asset, and
   a digital model system is configured to:
      receive data characterizing one or more sensors configured to detect the first property of the asset,
      determine the first graphical representation of the asset based on the received data identifying the industrial asset, and the second graphical representation of the first sensor of the one or more sensors based on the received data characterizing one or more properties of one or more sensors,
      communicate data characterizing the first graphical representation and the second graphical representation to the dashboard,
      wherein the dashboard is configured to render data characterizing the first graphical representation and the second graphical representation in the graphical display space.

9. A system comprising:
   at least one data processor;
   memory coupled to the at least one data processor, the memory storing instructions to cause the at least one data processor to perform operations comprising:
      receiving data identifying an industrial asset;
      receiving data characterizing one or more sensors configured to detect a first property of the asset;
      determining a first graphical representation of the asset based on the received data identifying the industrial asset, and a second graphical representation of a first sensor of the one or more sensors based on the received data characterizing one or more properties of one or more sensors;
      rendering, in a graphical display space, the first graphical representation and the second graphical representation, wherein one or more visual properties of the second graphical representation are indicative of one or more properties of at least one of the first sensor and the detected first property of the asset,
         wherein a position of the second graphical representation in the graphical display space relative to the first graphical representation is indicative of a first location of the first sensor on the asset
         receiving a first user input indicative of a selection of the first sensor;
         determining a third graphical representation of a cross-section of the asset at the first location, the third graphical representation indicative of one or more sensor element locations of one or more sensor elements of the first sensor on the cross-section of the asset; and
         rendering the third graphical representation in the graphical display space.

10. The system of claim 9, wherein the operations further comprising:
   receiving a second user input indicative of a selection of a first sensor element of the one or more sensor elements;
   determining a first plot indicative of the first property of the asset and detected by the first sensor element at a first sensor element location of the one or more sensor element locations; and
   rendering the first plot in the graphical display space.

11. The system of claim 10, wherein the operations further comprising:
   receiving a third user input indicative of a selection of a second sensor element of the one or more sensor elements;
   determining a second plot indicative of the first property of the asset and detected by the second sensor element at a second sensor element location of the one or more sensor element locations; and
   rendering the second plot in the graphical display space, wherein the second plot is superimposed on the first plot.

12. The system of claim 10, wherein the operations further comprising:
   receiving a second user input indicative of selection of a second sensor of the one or more sensors, the second sensor located at a second location on the asset;
   determining a fourth graphical representation of a second cross-section of the asset at the second location, the fourth graphical representation indicative of one or more sensor element locations of one or more sensor elements of the second sensor on the second cross-section of the asset; and
   rendering the fourth graphical representation in the graphical display space.

13. The system of claim 9, wherein the one or more visual properties of the second graphical representation comprises a color of the second graphical representation indicative of the first property of the industrial asset detected by the first sensor.

14. The system of claim 9, wherein the one or more visual properties of the second graphical representation comprises an opacity of the second graphical representation indicative of a corrosion rate associated with the industrial asset detected at the first location detected by the first sensor.

15. The system of claim 9, wherein the first property comprises a wall thickness of the asset.

16. The system of claim 9, wherein
   a dashboard is configured to receive data identifying the industrial asset, and
   a digital model system is configured to:
      receive data characterizing one or more sensors configured to detect the first property of the asset,
      determine the first graphical representation of the asset based on the received data identifying the industrial asset, and the second graphical representation of the first sensor of the one or more sensors based on the received data characterizing one or more properties of one or more sensors,
      communicate data characterizing the first graphical representation and the second graphical representation to the dashboard,
      wherein the dashboard is configured to render data characterizing the first graphical representation and the second graphical representation in the graphical display space.

* * * * *